(12) United States Patent
Ullo et al.

(10) Patent No.: US 10,573,574 B2
(45) Date of Patent: Feb. 25, 2020

(54) DEVICES FOR COOLING AND POWER

(71) Applicant: SCHLUMBERGER TECHNOLOGY CORPORATION, Sugar Land, TX (US)

(72) Inventors: John J. Ullo, Bethel, CT (US); Tsutomu Yamate, Kanagawa (JP); Jiro Takeda, Tokyo (JP)

(73) Assignee: SCHLUMBERGER TECHNOLOGY CORPORATION, Cambridge, MA (US)

( * ) Notice: Subject to any disclaimer, the term of this patent is extended or adjusted under 35 U.S.C. 154(b) by 1020 days.

(21) Appl. No.: 14/168,889

(22) Filed: Jan. 30, 2014

(65) Prior Publication Data

US 2014/0146480 A1 May 29, 2014

Related U.S. Application Data

(63) Continuation of application No. 11/948,589, filed on Nov. 30, 2007, now abandoned.

(60) Provisional application No. 60/882,408, filed on Dec. 28, 2006.

(51) Int. Cl.

| | |
|---|---|
| H01L 23/34 | (2006.01) |
| E21B 47/01 | (2012.01) |
| F25B 21/02 | (2006.01) |
| H01L 35/16 | (2006.01) |
| H01L 35/32 | (2006.01) |

(52) U.S. Cl.
CPC ............ *H01L 23/34* (2013.01); *E21B 47/011* (2013.01); *F25B 21/02* (2013.01); *H01L 35/16* (2013.01); *H01L 35/32* (2013.01); *H01L 2224/16225* (2013.01); *H01L 2224/32225* (2013.01); *H01L 2224/48091* (2013.01); *H01L 2224/73204* (2013.01); *H01L 2924/00011* (2013.01); *H01L 2924/00014* (2013.01); *H01L 2924/12032* (2013.01)

(58) Field of Classification Search
CPC .......... F25B 21/02; H01L 23/38; H01L 35/32; H01L 35/16; H01L 23/34; H01L 2924/00011; H01L 2924/12032
USPC ........................................................ 136/203
See application file for complete search history.

(56) References Cited

U.S. PATENT DOCUMENTS

| | | | |
|---|---|---|---|
| 4,922,822 A * | 5/1990 | Bierschenk | ........... H01L 35/325 136/204 |
| 5,430,322 A | 7/1995 | Koyanagi et al. | |
| 5,690,807 A | 11/1997 | Clark et al. | |
| 5,900,071 A * | 5/1999 | Harman | .................. H01L 35/16 136/236.1 |
| 5,936,192 A | 8/1999 | Tauchi | |

(Continued)

OTHER PUBLICATIONS

U.S. Appl. No. 60/796,531, filed May, 2006.
(Continued)

*Primary Examiner* — Kun Kai Ma

(57) ABSTRACT

Certain embodiments disclosed herein are directed to devices for cooling. In certain examples, a thermoelectric device comprising a substrate and a superlattice coupled to the substrate is disclosed. In some examples, the superlattice includes a first semi-conducting material and a second semi-conducting material coupled to the first semi-conducting material to provide an interface between the first and second semi-conducting materials.

17 Claims, 19 Drawing Sheets

(56) References Cited

U.S. PATENT DOCUMENTS

| | | | | |
|---|---|---|---|---|
| 6,060,657 A * | 5/2000 | Harman | ............... | H01L 35/16 |
| | | | | 136/203 |
| 6,064,137 A | 5/2000 | Cox | | |
| 6,089,311 A | 7/2000 | Edelson | | |
| 6,134,892 A | 10/2000 | Turner et al. | | |
| 6,444,896 B1 * | 9/2002 | Harman | ............... | B82Y 10/00 |
| | | | | 136/203 |
| 6,494,048 B1 * | 12/2002 | Ghoshal | ............... | F25B 21/02 |
| | | | | 62/3.2 |
| 6,505,468 B2 | 1/2003 | Venkatasubramanian | | |
| 6,605,772 B2 | 8/2003 | Harman et al. | | |
| 6,639,242 B1 | 10/2003 | Chen et al. | | |
| 6,711,904 B1 * | 3/2004 | Law | ............... | F25B 21/02 |
| | | | | 257/E23.08 |
| 6,784,073 B1 | 8/2004 | Fisher | | |
| 7,017,662 B2 | 3/2006 | Schultz et al. | | |
| 2002/0053359 A1 * | 5/2002 | Harman | ............... | B82Y 10/00 |
| | | | | 136/205 |
| 2002/0092557 A1 * | 7/2002 | Ghoshal | ............... | H01L 35/30 |
| | | | | 136/201 |
| 2003/0113950 A1 * | 6/2003 | Cooper | ............... | H01L 35/10 |
| | | | | 438/54 |
| 2004/0018729 A1 * | 1/2004 | Ghoshal | ............... | H01L 35/16 |
| | | | | 438/689 |
| 2004/0101750 A1 * | 5/2004 | Burch | ............... | H01M 8/04022 |
| | | | | 429/200 |
| 2006/0090787 A1 * | 5/2006 | Onvural | ............... | H01L 35/04 |
| | | | | 136/212 |
| 2006/0118158 A1 * | 6/2006 | Zhang | ............... | H01L 35/16 |
| | | | | 136/205 |
| 2006/0180192 A1 | 8/2006 | Sharp et al. | | |
| 2006/0213660 A1 | 9/2006 | DiFoggio et al. | | |
| 2006/0289052 A1 * | 12/2006 | O'Quinn | ............... | H01L 35/08 |
| | | | | 136/230 |
| 2007/0035736 A1 | 2/2007 | Vannuffelen et al. | | |
| 2007/0107764 A1 * | 5/2007 | Kanatzidis | ............... | H01L 35/14 |
| | | | | 136/205 |
| 2007/0289315 A1 | 12/2007 | Larsson | | |
| 2008/0178920 A1 * | 7/2008 | Ullo | ............... | E21B 47/011 |
| | | | | 136/204 |
| 2009/0139244 A1 | 6/2009 | Ullo et al. | | |

OTHER PUBLICATIONS

Chen, et al., "Heat transfer in nanostructures for solid-state energy conversion", Transaction of the ASME, vol. 124, 2002, pp. 242-252.

Dresselhaus, et al., "Low-dimensional thermoelectric materials", Physics of the Solid State, vol. 41 (5), 1999, pp. 679-682.

Fan, et al., "High cooling power density SiGe/Si microcoolers", Electronics Letters, vol. 37 (2), 2001, pp. 126-127.

Fisher, "Energy and Nanotechnology: Strategy for the Future", Baker Institute for Public Policy, Rice University, 2005, pp. 1-118.

Harman, et al., "Quantum dot Superlattice Thermoelectric Materials and Devices", Science, vol. 297, 2002, pp. 2229-2232.

Hicks, et al., "Effect of quantum-well structures on the thermoelectric figure of merit", Physical Review B, vol. 47 (19), 1993, pp. 12727-12731.

Hicks, et al., "Thermoelectric figure of merit of a one-dimensional conductor", Physical Review B, vol. 47 (24), 1993, pp. 16631-16634.

Hishinuma, et al., "Refrigeration by combined tunneling and thermionic emission in vacuum: Use of nanometer scale design", Applied Physics Letters, vol. 78 (17), 2001, pp. 2572-2574.

Koga, et al., "Carrier pocket engineering applied to "strained" Si/Ge superlattices to design useful thermoelectric materials", Applied Physics Letters, vol. 75 (16), 1999, pp. 2438-2440.

Komatsu, et al., "Products information on thermo modules", KELK Ltd., http://www.komatsu-electronics.co.jp/english/thermo/index.html, Accessed Jul. 21, 2008, pp. 1-3.

Lazarenkova, et al., "Electron and phonon energy spectra in a three-dimensional regimented quantum dot superlattice", Physical Review B, vol. 66, 2002, pp. 1-9.

Lin, et al., "Theoretical investigation of thermoelectric transport properties of cylindrical Bi nanowires", Physical Review B, vol. 62 (7), 2000, pp. 4610-4623.

Lin, et al., "Thermoelectric properties of superlattice nanowires", Physical Review B, vol. 68, 2003, pp. 1-14.

Mahan, et al., "Multilayer Thermionic Refrigeration", Physical Review Letters, vol. 80 (18), 1998, pp. 4016-4019.

Mahan, et al., "Multilayer thermionic refrigerator and generator", Journal of Applied Physics, vol. 83 (9), 1998, pp. 4683-4689.

Miskovsky, et al., "Microelectronic cooling using the Nottingham effect and internal field emission in a diamond (wide band gap material) thin-film device", Applied Physics Letters, vol. 75 (14), 1999, pp. 2147-2149.

Moores, et al., "Performance Assessment of Thermoelectric Coolers for Use in High Temperature Electronics Applications", 18th International Conference of Thermoelectrics, 1999, pp. 31-34.

Muroyama, et al., "Fabrication of Carbon Nanotube Triod Using Helicon Plasma CVD with Electroplated NiCo Catalyst", Mat. Res. Soc. Symp. Proc., vol. 772, 2003, pp. 35-40.

Shakouri, et al., "Enhanced Thermionic Emission Cooling in High Barrier Superlattice Heterostructures", Mat. Rec. Soc. Symp. Proc., vol. 545, 1999, pp. 449-458.

Shakouri, et al., "Heterostructure integrated thermionic coolers", Applied Physics Letters, vol. 71 (9), 1997, pp. 1234-1236.

Shakouri, et al., "Thermionic emission cooling in single barrier heterostructures", Applied Physics Letters, vol. 74 (1), 1999, pp. 88-89.

Tavkhelidze, et al., "Electron Tunneling Through Large Area Vacuum Gap—Preliminary Results", 21st International Conference on Thermoelectronics, 2002, pp. 435-438.

Vaidyanathan, et al., "Preliminary studies in the electrodeposition of PbSe/PbTe superlattice thin films via electrochemical atomic layer deposition (ALD)", Langmuir, vol. 22, Sep. 2006, pp. 10590-10595.

Vashaee, et al., "Electronic and thermoelectronic transport in semiconductor and metallic superlattices", Journal of Applied Physics, vol. 95 (3), 2004, pp. 1233-1245.

Vashaee, et al., "Improved Thermoelectric Power Factor in Metal-Based Superlattices", Physical Review Letters, vol. 92 (10), 2004, pp. 1-4.

Venkatasubramanian, et al., "Lattice thermal conductivity reduction and phonon localizationlike behavior in superlattice structures", Physical Review B, vol. 61 (4), 2000, pp. 3091-3097.

Venkatasubramanian, et al., "Superlattice Thin-film Thermoelectric Materials and Devices", Mat. Rec. Soc. Symp. Proc., vol. 793, 2004, pp. 51-58.

Venkatasubramanian, "Thin-film thermoelectric devices with high room-temperature figures of merit", Nature, vol. 413, 2001, pp. 597-602.

Zeng, et al., "Cooling Power Density of SiGe/Si Superlattice Micro Refrigerators", Mat. Rec. Soc. Symp. Proc., vol. 793, 2004, pp. s2.2.1-s2.2.7.

* cited by examiner

DEVICES FOR COOLING AND POWER

CROSS-REFERENCE TO RELATED APPLICATIONS

This application is a continuation of co-pending U.S. patent application Ser. No. 11/948,589 filed Nov. 30, 2007, which claims the benefit of U.S. Provisional Patent Application Ser. No. 60/882,408 filed Dec. 28, 2006. Both of these applications are incorporated herein by reference in their entireties.

FIELD OF THE TECHNOLOGY

Embodiments of the technology disclosed herein relate generally to devices for cooling and power. More particular, certain embodiments of devices disclosed herein relate to thermoelectric cooling devices having a hybrid structure. On such hybrid structure may include at least one superlattice.

BACKGROUND

Providing cooling to electrical components in downhole applications, such as sensors or other kinds of devices that operate properly below a certain temperature and are used, for example, in borehole drilling, logging measurements and the like is desirable to reduce equipment failure and improve the accuracy of measurements of physical properties of potential petroleum bearing rock formations. A significant drawback to existing cooling devices is that cooling time may be limited, such as in the case of dewars filled with a cooling fluid. In other configurations, power must be provided to the device downhole. Providing power requires substantial amounts of cabling to provide for electrical coupling between a power source uphole and a device located downhole.

SUMMARY

For the purpose of clarity, a thermoelectric device having a substrate and a first superlattice coupled to the substrate is described. One skilled in the art will readily recognize that the present invention may be practiced with a variety of thermoelectric cooling (TEC) devices having a variety of structural arrangements. For example, a hybrid TEC device may be configured with nano and bulk TECs. As understood by one skilled in the art, existing bulk TEC devices can provide a larger temperature difference as compared to existing nano TEC devices. This said, existing bulk TEC devices have a lower heat pump capacity as compared to existing nano TEC devices. In contrast, as understood by one skilled in the art, nano TEC devices offer a greater heat pump capacity with a lower potential temperature difference as compared to existing bulk TEC devices. In view of this, a hybrid arrangement employing both nano and bulk TEC devices may result in a TEC device capable of a large temperature difference and better efficiency.

In accordance with a first aspect, a thermoelectric device comprising a substrate and a first superlattice coupled to the substrate is disclosed. In certain examples, the first superlattice of the thermoelectric device comprises a first material and a second material coupled to the first material to provide an interface between the first and second materials. In some examples, the thermoelectric device also comprises a power source electrically coupled to first superlattice. In certain examples, the first material and the second material may each be a metal, a semi-conducting material or combinations thereof.

In accordance with another aspect, a device comprising a substrate and a plurality of individual superlattices coupled to the substrate is provided. In certain examples, each of the superlattices comprises a first material and a second material coupled to the first material to provide an interface between the first and second materials. In some examples, the device also includes a power source electrically coupled to at least one of the plurality of individual superlattices. In certain examples, the first material and the second material may each be a metal, a semi-conducting material or combinations thereof.

In accordance with another aspect, a cooling device comprising a thermoelectric material disposed on a superlattice is disclosed. In certain examples, the device may be configured to cool an electrical component below an ambient temperature. In other examples, the device may be configured to cool an electrical component to an ambient temperature. The cooling device may be used to cool many different types of electrical components, and illustrative electrical components are discussed in more detail below. In certain examples, the material used in the superlattice may be a metal, a semi-conducting material or combinations thereof.

In accordance with an additional aspect, a method of cooling a downhole electrical component is disclosed. In certain examples, the method comprises providing thermal communication between a thermoelectric device and the downhole electrical component. In some examples, the thermoelectric device comprises a substrate and a first superlattice coupled to the substrate. In certain examples, the first superlattice comprises a first material and a second material coupled to the first material to provide an interface between the first and second materials. In certain examples, the first material and the second material may each be a metal, a semi-conducting material or combinations thereof. In some examples, the method also includes providing cooling of the electrical component by heat transfer from the electrical component to the thermoelectric device.

In accordance with another aspect, a method of facilitating cooling of a downhole electrical component is provided. In certain examples, the method comprises providing a thermoelectric device that comprises a substrate and a first superlattice coupled to the substrate. In some examples, the first superlattice comprises a first material and a second material coupled to the first material to provide an interface between the first and second materials. In certain examples, the first material and the second material may each be a metal, a semi-conducting material or combinations thereof. In certain examples, the method also includes providing instructions for using the thermoelectric device to cool a downhole electrical component.

In accordance with an additional aspect, a kit for downhole cooling is disclosed. In certain examples, the kit comprises at least one thermoelectric device comprising a substrate and a superlattice coupled to the substrate. In certain examples, the superlattice comprises a first material and a second material coupled to the first material to provide an interface between the first and second materials. In certain examples, the first material and the second material may each be a metal, a semi-conducting material or combinations thereof. In some examples, the kit also comprises instructions for using the thermoelectric device to cool a downhole electrical component.

In accordance with another aspect, a device for use in a downhole tool is disclosed. In certain examples, the device comprises at least one electrical component and a thermoelectric device coupled to the at least one electrical component. In some examples, the thermoelectric device comprises a substrate and a superlattice coupled to the substrate. In certain examples, the superlattice comprises a first material and a second material coupled to the first material to provide an interface between the first and second materials. In certain examples, the first material and the second material may each be a metal, a semi-conducting material or combinations thereof.

In accordance with an additional aspect, a thermoelectric cooling device for cooling a downhole electrical component is provided. In certain examples, the thermoelectric cooling device comprises a superlattice that includes a material having a figure of merit ZT value of at least about two at 150° C.

Additional features, aspects and examples are described in more detail below.

BRIEF DESCRIPTION OF THE FIGURES

Certain embodiments are described below with reference to the accompanying figures in which.

Certain features shown in the figures may have been enlarged, distorted, altered or otherwise shown in non-conventional manner to facilitate a better understanding of the technology disclosed herein and to provide a more user-friendly version of the figures.

DETAILED DESCRIPTION

Certain embodiments of the devices and methods disclosed herein provide devices for cooling and power that may be used in many different environments such as, for example, downhole applications, aerospace applications, cooling of a microprocessor or other electrical components on a printed circuit board, cooling of scintillator crystals, cooling of sensor materials, ceramics, semiconductors, polymers and the like. In certain examples, the cooling device is configured for use in a device designed to make optical measurements, e.g., near infrared measurements, fluorescence, visible or ultraviolet absorption measurements, etc., on a sample.

In certain examples, the devices disclosed herein may be placed or brought in thermal communication with an electrical component to provide cooling of the electrical component. As used herein "thermal communication" refers to the condition where heat may be transferred to the thermoelectric device from the electrical component. The thermoelectric device and the electrical component are not necessarily in direct contact but are suitably positioned relative to each other so that heat may be transferred from the electrical component to the thermoelectric device.

Figure 1:
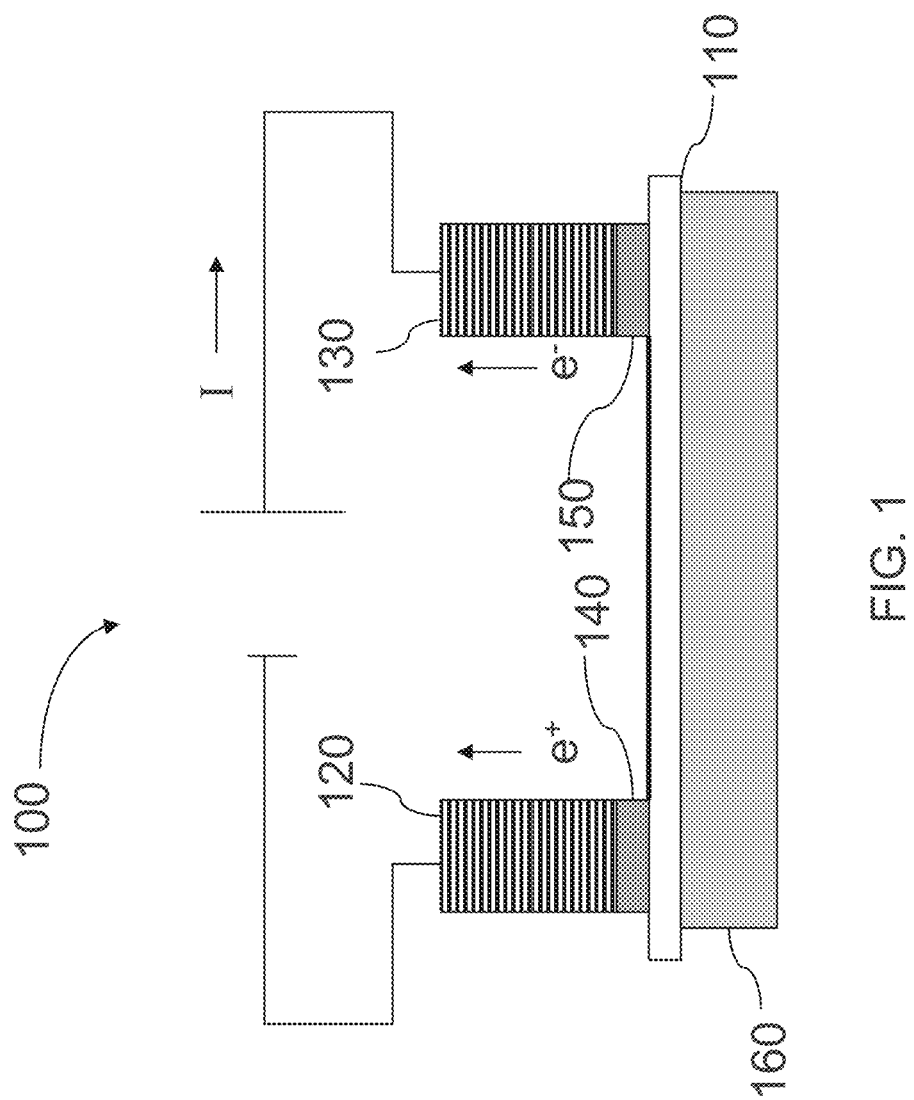
FIG. 1 is an illustrative thermoelectric device, in accordance with certain examples.

In accordance with certain examples, a hybrid thermoelectric device comprising a superlattice structure is shown in FIG. 1. The thermoelectric device comprising a superlattice is solely for illustrative purposes. One skilled in the art will readily recognize that alternative TEC devices may be utilized in practicing the present invention. The hybrid thermoelectric device 100 includes a substrate 110 with superlattice structures 120 and 130 coupled to the substrate 110. In certain examples, the superlattice structure 120 may be suitably doped to provide p-type conduction, and the superlattice structure 130 may be suitable doped to provide n-type conduction. In some examples, either or both of superlattice structures 120 and 130 may be in thermal communication with a heat sink to facilitate heat transfer. The substrate 110 may be a semi-conducting material, a metal or a non-metal, such as a plastic, that may conduct heat. The thermoelectric cooling device 100 may also include electrodes or contacts 140 and 150 to provide electrical coupling of the superlattices to a power source. The p-n couple is effective to provide cooling to a component in thermal communication with the substrate 110. After a current I is applied to the cooling device 100, electron transport is allowed in an applied field along the line shown in FIG. 1. Transport of the electrons provides a temperature difference that may be used to absorb thermal energy from the device to be cooled and transfer that thermal energy to the external environment. In certain embodiments, a material component, shown as element 160, may be coupled to the substrate 110 to facilitate transfer of heat from the electrical component (not shown) to the device 100.

In accordance with certain examples, the exact material used in the superlattices may vary depending on the intended application of the device, desired cooling or power generation capabilities and the like. In certain examples, the superlattice may comprise alternating layers of semi-conducting materials with an interface between the layers of semi-conducting materials. In other examples, the superlattice may comprise alternating metal layers with an interface between each metal layer. In other examples, the superlattice may comprise alternating layers of a semi-conducting material and a metal with an interface between each semi-conducting material layer and metal layer. In other configurations, any two different materials that provide an interface between them and that provide cooling capabilities or power generation capabilities, as the case may be, may be used in a superlattice. It will be within the ability of the person of ordinary skill in the art, given the benefit of this disclosure, to select suitable materials for use in a superlattice.

In accordance with certain examples, conventional materials for doping to provide p-type conduction depend on the host semiconductor and in the case of Si include, but are not limited to such elements as boron and aluminum. One skilled in the art will readily recognize that numerous alternatives exist which are applicable to the present invention. In view of this those examples recited herein are not intended to be limiting in scope. Superlattices that are doped to provide p-type conduction are referred to in some instances herein as a "p-type superlattice." Conventional materials for doping to provide n-type conduction depend on the host semiconductor, and in the case of Si include, but are not limited to phosphorous, arsenic and antimony. In view of this those examples recited herein are not intended to be limiting in scope. Superlattices that are doped to provide n-type conduction are referred to in some instances herein as an "n-type superlattice." It will be recognized by the person of ordinary skill in the art, given the benefit of this disclosure, that the exact material used to provide an n-type or a p-type superlattice may depend on the other materials selected for use in the superlattice.

Figure 2:
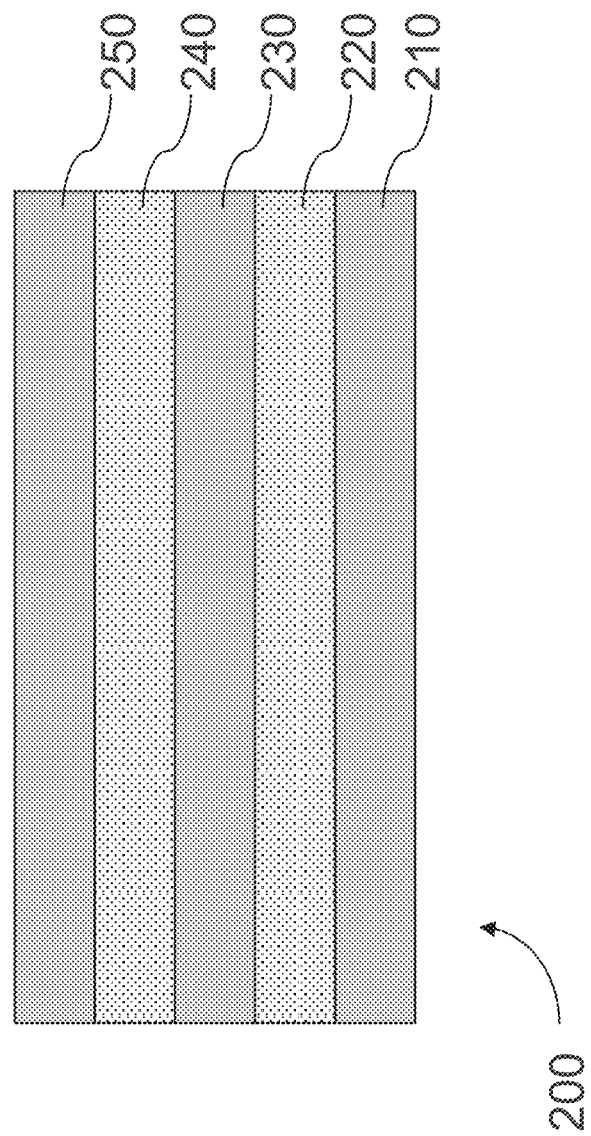
FIG. 2 is a schematic of a superlattice, in accordance with certain examples.

In accordance with certain examples, the superlattice structures may include alternating layers of semi-conducting materials. For example, the superlattice may include BiTe/SbTe layers, PbSe/PbS layers and PbSe/PbTe layers with the thickness of each of the layers selected to be about 2 nm to about 20 nm, more particularly about 3 nm to about 10 nm. An illustrative superlattice is shown in FIG. 2. The superlattice 200 includes a first layer 210, a second layer 220, a third layer 230, a fourth layer 240 and a fifth layer 250. One skilled in the art will recognize that the five layer example of FIG. 2 is solely for illustrative purposes and clarity. In practice the superlattice structure may include a plurality of layers as required. In certain examples, alternating layers of the superlattice 200 may be made of the same material or substantially the same material, e.g., layers 210, 230 and 250 may be the same material. In certain embodiments, the superlattice structure includes alternating material layers with high and low conduction bands (or valence bands in the case of p-type conduction). Electron ($e^-$) and hole ($e^+$) transport may be provided in the direction as shown in FIG. 1.

In accordance with certain examples, the thickness of the layers may be substantially the same, whereas in other examples, the thickness of the layers may each vary and may be different from other layers. In certain examples, the thickness of each layer may be individually tuned or optimized to provide a uniform thickness period, a non-uniform thickness period, reduction of Ohmic heating or other desired physical properties to the thermoelectric device. In certain embodiments, layer thickness may be optimized to block phonons or reduce phonon transport across the superlattice interface so as to reduce or minimize back flow of heat from the hot to cold sides of the cooling device. Without wishing to be bound by any particular scientific theory, it is believed that the interfaces of the materials deflect phonons and reduce phonon transport across the layers of the superlattice.

In accordance with certain examples, the layers of the superlattice may be coupled to the substrate using many suitable methods. In some examples, the superlattice may be directly coupled to the substrate without any intervening or interstitial materials or layers, whereas in other examples, one or more intervening or interstitial layers, or other selected devices or layers, may be disposed between the substrate and the superlattice. In certain examples, a superlattice may be deposited using, for example, chemical vapor deposition, physical vapor deposition, vapor-phase epitaxy, molecular-beam epitaxy, sputtering and other methods commonly used to deposit semi-conducting materials and metals on a substrate. In some examples, the superlattice may be coupled to the substrate by brushing, printing, wiping or otherwise disposing the material on the substrate. The layers may be disposed as a monolayer of atoms or may be disposed by bulk application of atoms onto a substrate to provide a desired thickness. In some examples, the layers may be formed in a monolithic fashion. In certain examples, one or more post-deposition steps may be performed to provide a desired thickness or other desired physical property or dimensions. Post-deposition steps include, but are not limited to, sintering, polishing, etching, sand blasting, grit blasting, thermal treatment and the like.

Figure 3:
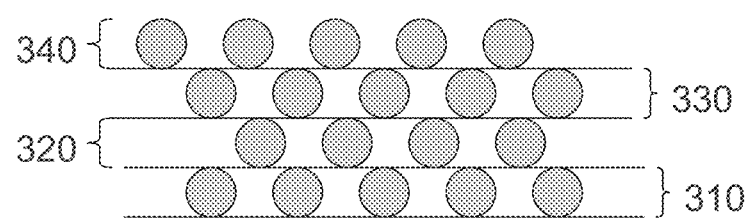
FIG. 3 is a schematic of a superlattice comprising quantum dots, in accordance with certain examples.

In certain embodiments, the superlattice may comprise quantum dots. For example and referring to FIG. 3, a plurality of quantum dots is shown arranged in layers 310, 320, 330 and 340. The quantum dots are not necessarily in physical contact with each other. To provide conduction between various quantum dots, electrons may tunnel from one quantum dot to another in accordance with known quantum mechanical tunneling phenomena. The quantum dots may be configured in many different manners including, but not limited to, two-dimensional or three dimensional arrays. Suitable quantum dots for use in the superlattices disclosed herein may include lead salt quantum dots, such as PbTe/PbSe dots doped with TlSe or a lead salt quantum dot doped with $Bi_2Te_3$. Additional materials for use in quantum dots include those materials described, for example, in U.S. Pat. No. 5,690,807.

Figure 4:
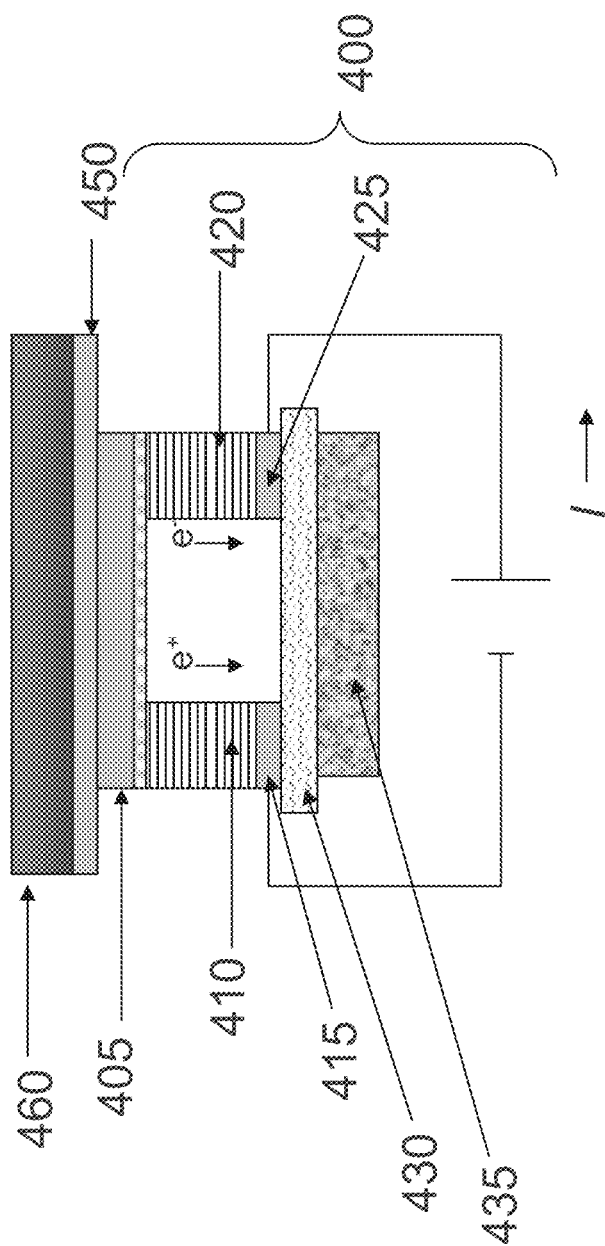
FIG. 4 is an illustrative packaged thermoelectric device, in accordance with certain examples.

In accordance with certain examples, a thermoelectric device coupled to a surface of a component to be cooled is shown in FIG. 4. The thermoelectric device 400 includes a first superlattice 410 and a second superlattice 420 coupled to a conductive substrate 405. The substrate 405 is shown as being coupled to the superlattices 410 and 420 through a bonding material. The bonding material may be any suitable metal, or any Ohmic material that is a metal or a non-metal, that may electrically couple the substrate to the superlattices, and illustrative bonding materials include, but are not limited to, copper, gold, platinum, and silver. The first superlattice 410 and the second superlattice 420 may be electrically coupled to a power source through electrodes 415 and 425, respectively. The electrodes 415 and 425 may be any suitable conductive material and may be formed or coated on the superlattices using vapor deposition techniques or by bringing the electrodes into electrical communication with the superlattices 410 and 420. Though the device shown in FIG. 4 is designed for cooling, by reversing the polarity of the current, the device can generate power.

In the illustrative device shown in FIG. 4, the thermoelectric device also includes a spacer 430 coupled to the electrodes 415 and 425 and a heat sink 435 coupled to the spacer. The spacer 430 is effective to conduct heat from the superlattices to the heat sink 435. The device 400 is shown coupled to a surface of an electrical component 460 to be cooled. Between the surface to be cooled and the device 400 may be a thermal conducting component 450. The thermal conducting component 450 is typically attached to a larger electrical device, which is shown schematically as 460 in FIG. 4. In operation, the thermoelectric cooling device 400 provides a temperature gradient such that heat from the electrical component 460 may be transferred down the temperature gradient. Heat may be dissipated to the external environment through heat sink 435, which may optionally include a fan (not shown).

In certain examples, the superlattices shown in FIG. 4 provide a p-n couple by configuring the superlattice 410 as a p-type superlattice and configuring the superlattice 420 as an n-type superlattice. For example, each superlattice 410 and 420 may include a first semi-conducting material and a second semi-conducting material coupled to the first semi-conducting material. The second semi-conducting material is usually different from the first semi-conducting material such that an interface is present between the first and second semi-conducting materials. In some examples, however, the first and second semi-conducting materials may be the same and one or more post-deposition steps may be performed to provide an interface between them. For example, a first semi-conducting layer may be deposited followed by a thin interface layer of a conductive material, e.g., a metal. Another layer of the first semi-conducting material may then be deposited on the conductive material. In certain examples, the superlattices each may include alternating semiconductor materials with high and low conduction bands (or valence bands in the case of p-type conduction) that allow electron transport in an applied field along the lines shown in FIG. 4. In some examples, the semi-conducting materials of the superlattices may be one or more of BiTe, SbTe, PbSe, PbS, PbTe or other semi-conducting materials. In certain embodiments configured for downhole applications, the semiconductor materials may be based on, for example, alternating layers of BiTe/SbTe, PbSe/PbS, or PbSe/PbTe, alternating metal layers or combinations of metals and semiconductors. In certain examples, the structures may be optimized for layer thickness period in the case of a uniform period, distribution of layer thicknesses for the case of non-uniform periods, number of layers, doping and reduced Ohmic (Joule) heating at the electrodes. The optimization of layer thicknesses may also exploit phonon blocking or reduce phonon transport across the superlattice interfaces so as to minimize backflow of heat from the hot to cold sides.

Figure 5:
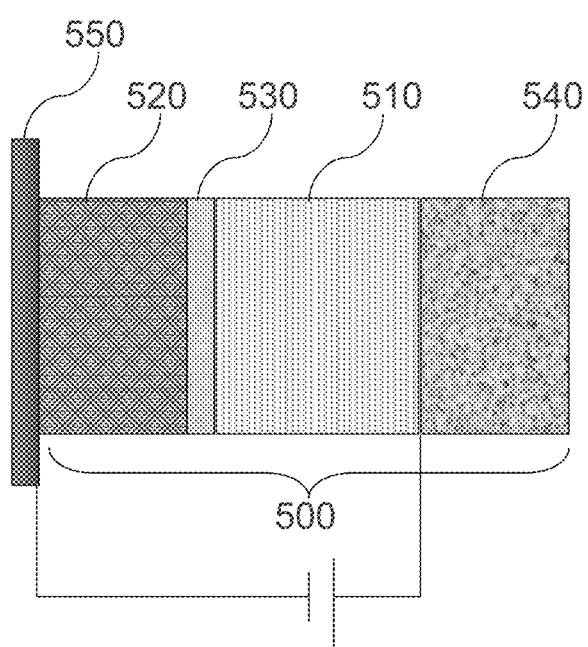
FIG. 5 is an illustrative thermoelectric device that includes a Schottky barrier, in accordance with certain examples.

In accordance with certain examples, a thermoelectric-like device comprising at least one superlattice is provided. As used herein, the term "thermoelectric-like" refers to devices and materials whose properties may be analyzed in a manner similar to those of thermoelectric materials, e.g., figures of merit ZT, as discussed below, are relied on for performance characteristics. For purposes of this disclosure and the appended claims, the term thermoelectric device is intended to include thermoelectric-like devices. Illustrative thermoelectric-like devices include those described herein that implement field emission and/or thermionic emission. Referring to FIG. 5, a thermoelectric cooling device 500 includes a superlattice 510 coupled to a substrate 520. As discussed above, the superlattice may include a plurality of alternating layers of semi-conducting materials, quantum dots, metals, combinations thereof or other suitable materials. In one embodiment, the semiconductor layers consist of alternate high and low conduction bands (or valence bands in the case of p-type conduction) that allow electron transport in an applied field from the cathode side to the anode side of the superlattice 510. In certain embodiments, the semiconductor superlattice may include one or more of BiTe, SbTe, PbSe, PbS, PbSe and PbTe. In applications where the cooling device 500 is used to provide downhole cooling, the superlattice may include BiTe/SbTe, PbSe/PbS and PbSe/PbTe, alternating metal layers or combinations of metals and semiconductors. The thickness of each layer and/or the thickness of the overall composite structure may be controlled or optimized to provide for desired physical properties. For example, the thickness of the layers may be adjusted to provide for a uniform thickness period, distribution of layer thickness for the case of non-uniform thickness periods, doping, reduced Ohmic (Joule) heating at the metallic (or semiconductor) contacts, and induced layer surface roughness. The surface roughness may be designed to promote non-conservation of carrier lateral momentum across the planes, as discussed in more detail below, without reducing carrier mobility which can add Joule heating and consequent reduction in device efficiency. The optimization of the superlattice layer thickness or the thickness distribution may also address the reduction of phonon transport at the interfaces so as to minimize or reduce backflow of heat from the hot to cold sides.

In accordance with certain examples, the substrate 520 and the superlattice 510 may be selected such that a Schottky barrier 530 is promoted between them. Though for illustrative purposes the Schottky barrier 530 is shown as a separate layer in FIG. 5, the Schottky barrier 530 is not an actual layer, but an interfacial energy barrier. A Schottky barrier is an energy barrier created between a metal-semiconductor junction and has rectifying characteristics such as, for example, those commonly found in a diode. In certain examples, the Schottky barrier has a barrier height of less than about 0.5 eV. The substrate 520 is typically a metal, with a metal having a low work function being preferred, e.g., a metal with a work function less than about 1 eV.

In accordance with certain examples, the device may also include a heat sink 540 coupled to the superlattice 510 to conduct heat from the superlattice 510 to the external environment. As discussed above, the heat sink may include one or more thermally conductive materials such as, for example, copper, gold, platinum, silver and the like. The heat sink 540 may include fins, a fan, or other configurations or devices that can facilitate heat transfer to the surrounding environment. The entire device 500 may be coupled to a surface 550 to be cooled, such as a surface of an electrical component including, but not limited to, a surface of an integrated circuit.

In accordance with certain examples, the device shown in FIG. 5 may be configured for downhole cooling in an ambient environment that exceeds 150° C., 200° C. or even 250° C. As discussed in more detail below, the superlattice materials may be selected such that the temperature of the surface to be cooled does not exceed 200° C., more particularly does not exceed 170° C. In certain embodiments, lead based semi-conducting materials may be included in the superlattice to provide a cooling device that keeps an electrical component below about 200° C. In examples where an electrical component is subjected to temperatures above 200° C., it may be desirable to use high temperature solders to electrically couple the electrical component to a larger device, e.g., a printed circuit board, and to prevent reflow of any solder joints.

Figure 6:
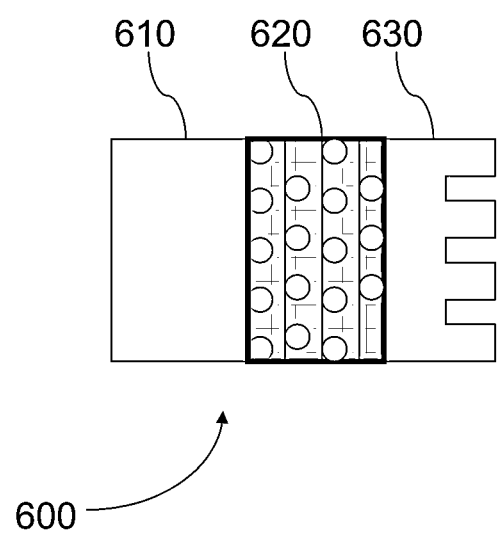
FIG. 6 is an illustrative thermoelectric device comprising quantum dots, in accordance with certain examples.

In accordance with certain examples, the superlattice 510 used in the cooling device 500 may include quantum dots. For example the superlattice may consist of layers of quantum dots that are not in contact with each other. Electrons can tunnel from one quantum dot to another to provide electrical conductivity. An illustrative device is shown in FIG. 6. The device 600 includes a metal or semiconductor substrate 610 with a quantum dot superlattice 620 coupled thereto. A heat sink 630 may be coupled to the superlattice 620 to conduct heat away from the superlattice 630 to the external environment. In an alternative configuration, the superlattice 620 may include at least one superlattice wire (SLW), as discussed in more detail below.

Figure 7:
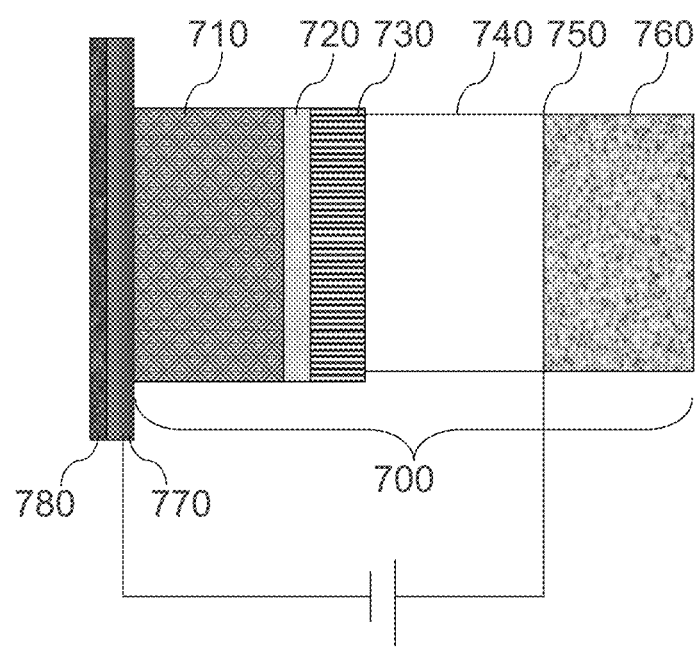
FIG. 7 is an illustrative thermoelectric device comprising a vacuum or quantum well, in accordance with certain examples.

In accordance with certain examples, another example of a thermoelectric-like device is shown in FIG. 7. The thermoelectric-like device shown in FIG. 7 is configured to use thermal emission to provide cooling. Referring to FIG. 7, the thermoelectric-like device 700 includes a substrate 710, a field emitter 730 and a Schottky barrier 720 promoted between the substrate 710 and the field emitter 730. As discussed above in reference to FIG. 5, though for illustrative purposes the Schottky barrier 720 is shown as a separate layer in FIG. 7, the Schottky barrier 720 is not an actual layer as recited previously. The device 700 also includes a vacuum or multi-quantum well structure 740, an anode 750 and a heat sink 760. In certain examples, the substrate 710 may be a metal or metal alloy with a low work function being preferable, e.g., having a work function less than about 1 eV. In some examples, the substrate 710 may be a semiconductor such as a degenerate semiconductor. Notwithstanding the makeup of the substrate 710, the substrate 710 and the field emitter 730 may be selected such that a Schottky barrier 720 is promoted between them. In some examples, the materials are selected such that a Schottky barrier having a barrier height of less than about 0.1-0.2 eV is promoted to mimic a low work function metal. Once electrons are transported to the vacuum or multi-well source, they may migrate under the applied field toward the heat sink 760. The device 700 is shown in FIG. 7 as being coupled to a thermal conductor 770. The thermal conductor 770 is in thermal communication with a surface 780 to be cooled. In certain examples, the thermal conductor 770 may be integrated into the device 700 such that the entire structure may be coupled to a surface to be cooled.

In accordance with certain examples and as discussed in more detail below, the field emitter 730 may be configured to provide thermionic emission injection. In certain examples, the field emitter 730 is a lattice of current carrying elements manufactured from a material or materials offering ballistic conduction. For example a wide band gap semiconductor or carbon nanotubes may be utilized as the field emitter 730 in accordance with one embodiment of the present invention. In some examples, the wide band gap semiconductor may be one or more of diamond, carbon nanotubes, GaN, SiC or other semi-conducting materials disclosed herein. One preferred property of the field emitter 730 is that it allows for ballistic or near ballistic transport of electrons from the substrate to the vacuum or multi-quantum well structure 740 and to the metal anode 750.

In accordance with certain examples, the device 700 may be packaged for use in environments that exceed 150° C.

When the device 700 is packaged, it may include thermal conductor 770 integrated into the device 700. In certain examples, the package may be coupled to a surface to be cooled, e.g., a surface of an electrical component, to provide cooling to the surface and to allow any device in thermal communication with the device 700 to transfer heat to the device 700. In certain examples, the device 700 provides sufficient cooling such that the surface temperature does not exceed 170° C., more particularly, the surface temperature does not exceed 200° C. The device 700 may be used in downhole applications to provide continuous cooling to electrical components, such as those mounted or integral to a printed circuit board. In particular, the device 700 may be used to cool integrated circuits of downhole devices that are exposed to a surrounding environment greater than about 150° C.

Figure 8:
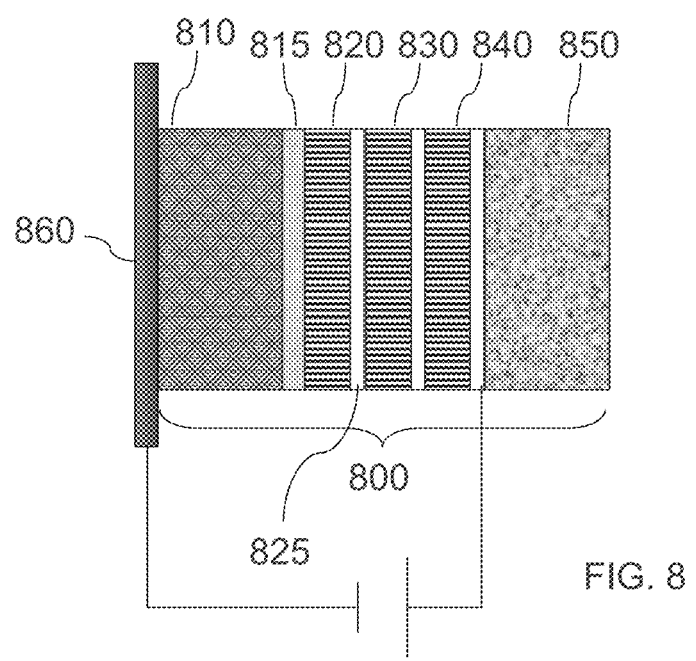
FIG. 8 is an illustrative thermoelectric device comprising a plurality of elements as in FIG. 7.

In accordance with certain examples, another embodiment of a thermoelectric-like device is shown in FIG. 8. The device 800 includes a substrate 810 with a plurality of superlattices 820, 830 and 840 coupled to the substrate 810. As shown in FIG. 8, each of the superlattices 820, 830 and 840 may be separated from an adjacent superlattice by a vacuum or quantum-well structure, such as vacuum 825. The device 800 may also include a heat sink 850 to facilitate transfer of heat from a surface 860 to be cooled through the device 800 and to the external environment.

In certain examples, the substrate 810 may be a metal or semi-conducting substrate. In some examples, the substrate 810 is a metal having a low work function, e.g., less than about 1 eV. In certain examples, the material for the substrate may be selected to promote a Schottky barrier between the substrate 810 and the first superlattice 820. Though a Schottky barrier 815 is shown in FIG. 8 as a separate layer or physical component of the device 800, it will be recognized by the person of ordinary skill in the art, given the benefit of this disclosure, that the Schottky barrier 815 is an energy barrier between the substrate 810 and the first superlattice 820 and is not an actual layer or physical component of the device 800.

In certain examples, each of the superlattices 820, 830 and 840 may be manufactured from one or more of diamond, carbon nanotubes, GaN, SiC or other conductive or semi-conducting materials. In some examples, the superlattices may each include highly conductive nanowires with corresponding high values of field emission such as, for example, diamond, carbon nanotube wires, fibers and composites. Additional suitable materials for use in the superlattices 820, 830 and 840 will be readily selected by the person of ordinary skill in the art, given the benefit of this disclosure.

In accordance with certain examples, the device 800 may be configured to allow Schottky barrier injection of electrons and ballistic or near ballistic transport of electrons through the superlattices, and through any vacuum or quantum-well structure separating the superlattices, to the heat sink 850. In certain examples, the superlattices may be constructed such that the electron paths have a high probability of intersecting the heat sink. For example, superlattices comprising several stages of ordered (aligned) carbon nanotube arrays in an applied field across a gap may be used to intercept emitted electrons and guide them across the gap to the heat sink. This arrangement allows the heat sink to be further removed from the hot surface without excessively increasing the probability of the transported electrons hitting the sides of the thermoelectric device. Such arrays of carbon nanotubes can be fabricated starting with a thin non-conducting material (e.g., a polymer) which has been penetrated across its thickness by an ordered or disordered array of nanopores.

The nanotubes may be grown inside the aligned pores furnishing conductive paths in the presence of an applied field. In place of nanotubes, other conductive wire materials, e.g., metals or semiconductors could be used as well.

Figure 9:
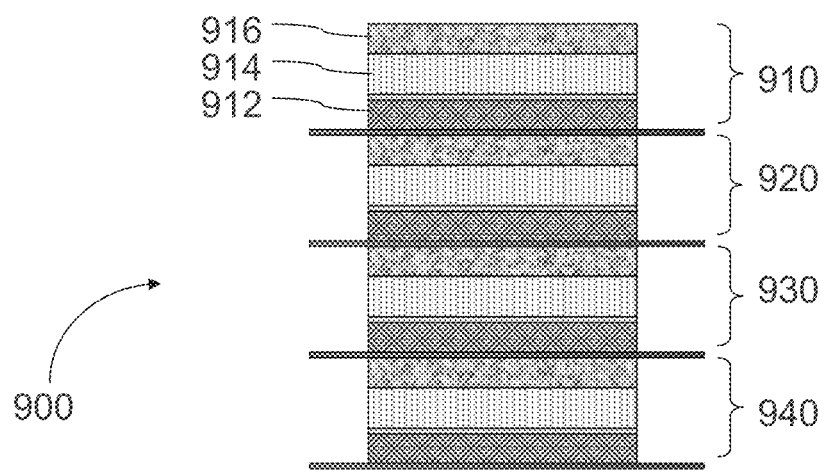
FIG. 9 is an illustrative device comprising multiple, stacked thermoelectric devices, in accordance with certain examples.

In accordance with certain examples, a composite device comprising a plurality of thermoelectric and thermoelectric-like devices stacked on each other is provided. Referring to FIG. 9, the device 900 comprises a first thermoelectric-like device 910 with a second thermoelectric-like device 920 coupled to the first thermoelectric-like device 910. In certain examples, the device may also include third thermoelectric-like device 930 and fourth thermoelectric-like device 940. A surface to be cooled is shown at the bottom region of the thermoelectric-like devices 910, 920, 930 and 940.

Referring to thermoelectric-like device 910 in FIG. 9, the thermoelectric-like device 910 includes a substrate 912, a superlattice 914 coupled to the substrate 912, and a heat sink 916 coupled to the superlattice 914. Each of thermoelectric-like devices 920, 930 and 940 may be constructed similar to thermoelectric-like device 910. Heat may be transferred from one thermoelectric-like device to another and to the external environment. The device shown in FIG. 9 may be used to provide large scale thermal management to achieve greater temperature reduction than may be achieved using a single thermoelectric-like device.

In certain examples, the materials for the substrate and the superlattice of the thermoelectric-like devices shown in FIG. 9 may be any one or more of those materials discussed herein for use as a substrate and for use in a superlattice. In some examples, the materials for the substrate and the superlattice may be selected to promote a Schottky barrier between them.

Figure 10:
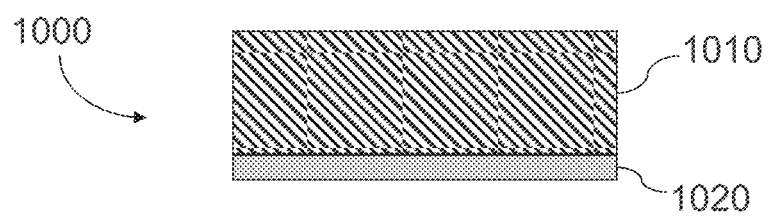
FIG. 10 is an illustrative schematic of a hybrid TEC device, in accordance with certain examples.

In accordance with certain examples, a hybrid thermoelectric device is disclosed. For illustrative purposes this hybrid thermoelectric device will be described as comprising a thermoelectric device disposed on a superlattice. One skilled in the art will recognize, however, that the hybrid device of the present invention may be comprised of various alternative TEC devices, including but not limited to a bulk TEC and a nano TEC devices. The present embodiment of a bulk TEC device disposed on a superlattice is solely for illustrative purposes and it not intended to be limiting in scope of the present invention. Without wishing to be bound by any particular scientific theory, by constructing a cooling device using both a thermoelectric bulk-like material and a superlattice, the advantages of both materials may be utilized. For example, the high heat capacity (efficiency) of the superlattice and the large temperature differential of the bulk thermoelectric material may be used together to construct a cooling device of high efficiency capable of providing a large change in temperature. An illustrative hybrid device is shown in FIG. 10. The device 1000 comprises a bulk thermoelectric material 1010 disposed on a superlattice 1020. The bulk thermoelectric material 1010 may include one or more of InGaZnO, $Bi_2Te_3$, $Zn_4Sb_3$, PbTe, SnTe, SiGe, $CeFe_4Sb_{12}$, $CoSb_3$, $La_2Te_3$ and other thermoelectric materials that will be readily selected by the person of ordinary skill in the art, given the benefit of this disclosure. The superlattice 1020 may be any one or more of the illustrative superlattices disclosed herein, e.g., nanowires, carbon nanotubes, quantum dots, metals, semi-conducting materials and the like. Additional suitable materials for use in the superlattice 1020 will be readily selected by the person of ordinary skill in the art, given the benefit of this disclosure. The thermoelectric material may be disposed on the superlattice using many different techniques including, but not limited to, vapor deposition, sputtering, spin coating and other techniques.

Figure 11:
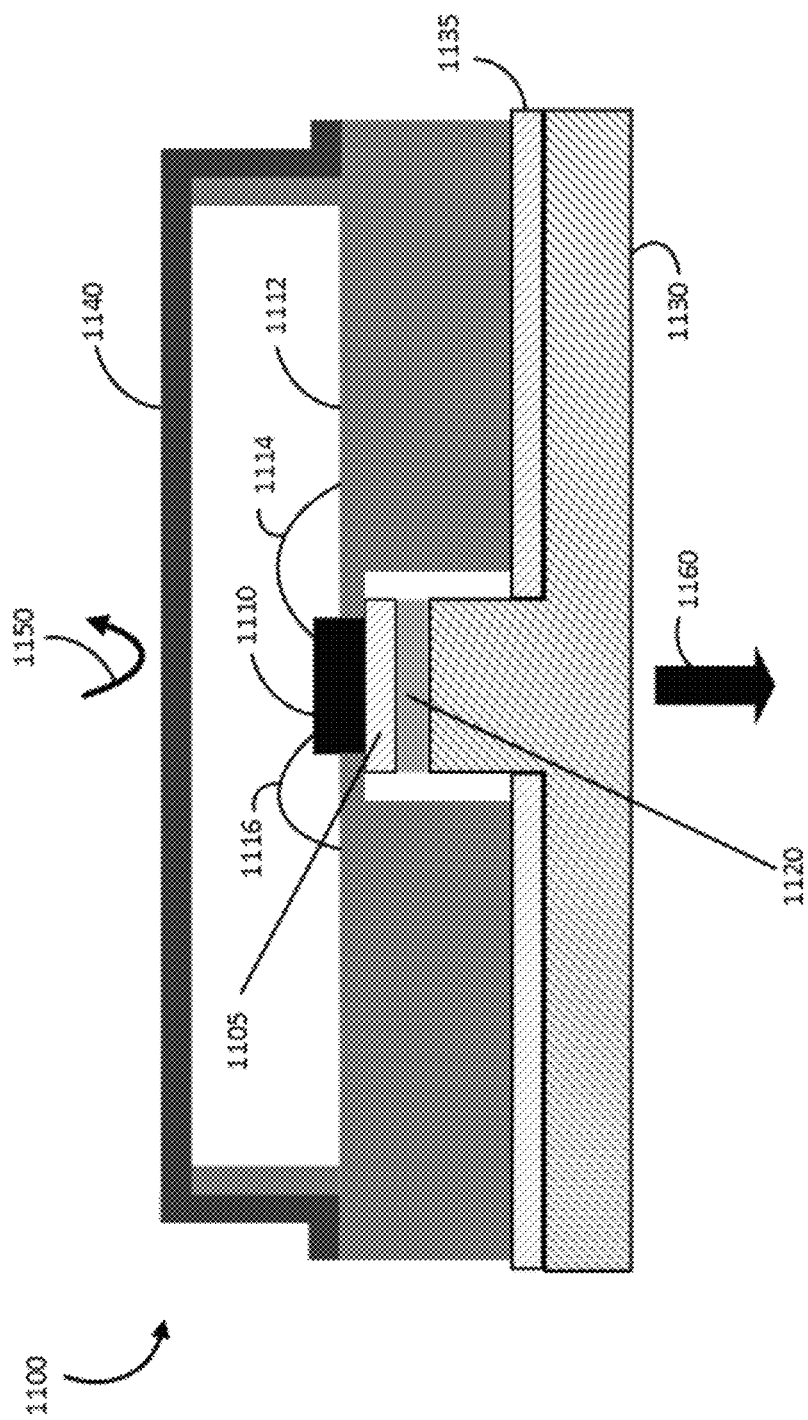
FIG. 11 is an illustrative schematic of a package for use in cooling applications, in accordance with certain examples.

In accordance with certain examples, a hybrid thermoelectric device 1105 is shown in FIG. 11 in a package 1100. In the illustration shown in FIG. 11, the hybrid thermoelectric device 1105 comprises a bulk thermoelectric disposed on a superlattice. As set forth previously, this hybrid thermoelectric device 1105 may be composed of a variety of suitable TEC devices, as understood by one skilled in the art. The hybrid thermoelectric device 1105 has been configured in a package 1100 for use in an environment where an electrical component 1110 is to be cooled below an ambient temperature. Such a situation may occur, for example, in a downhole setting where the ambient temperature may exceed a desired operating temperature of the electrical component 1110. The electrical component 1110 is electrically coupled to a printed circuit board 1112 through interconnects 1114 and 1116. The hybrid thermoelectric device 1105 is in thermal communication with the electrical component 1110. A thermal interface 1120 is in thermal communication with the hybrid thermoelectric device 1105 to transfer heat from the hybrid thermoelectric device 1105 to a heat sink 1130. The package 1100 may also include an insulator 1135 to prevent or retard heat entry into the package 1100 from the ambient environment. The package 1100 may also include a heat reflection treatment 1140 to prevent or retard heat entry into the package 1100 and/or to reflect heat away from the package 1100 as shown by arrow 1150. In operation, heat may be transferred from the electrical component 1110 to the heat sink 1130 through the thermal interface 1120 and on to the external environment as shown by arrow 1160. The type of packaging shown in FIG. 11 may be particularly useful for imaging sensors, CCD's and in low power consumption devices. In accordance with one embodiment of the present invention a low power consumption device using less than several hundred milliwatts may be cooled to below the ambient temperature. In other embodiments, the package shown in FIG. 11 may be used to cool any electrical component including, but not limited to, optical sensors, microprocessors, memory chips, digital signal processors and the like.

Figure 12:
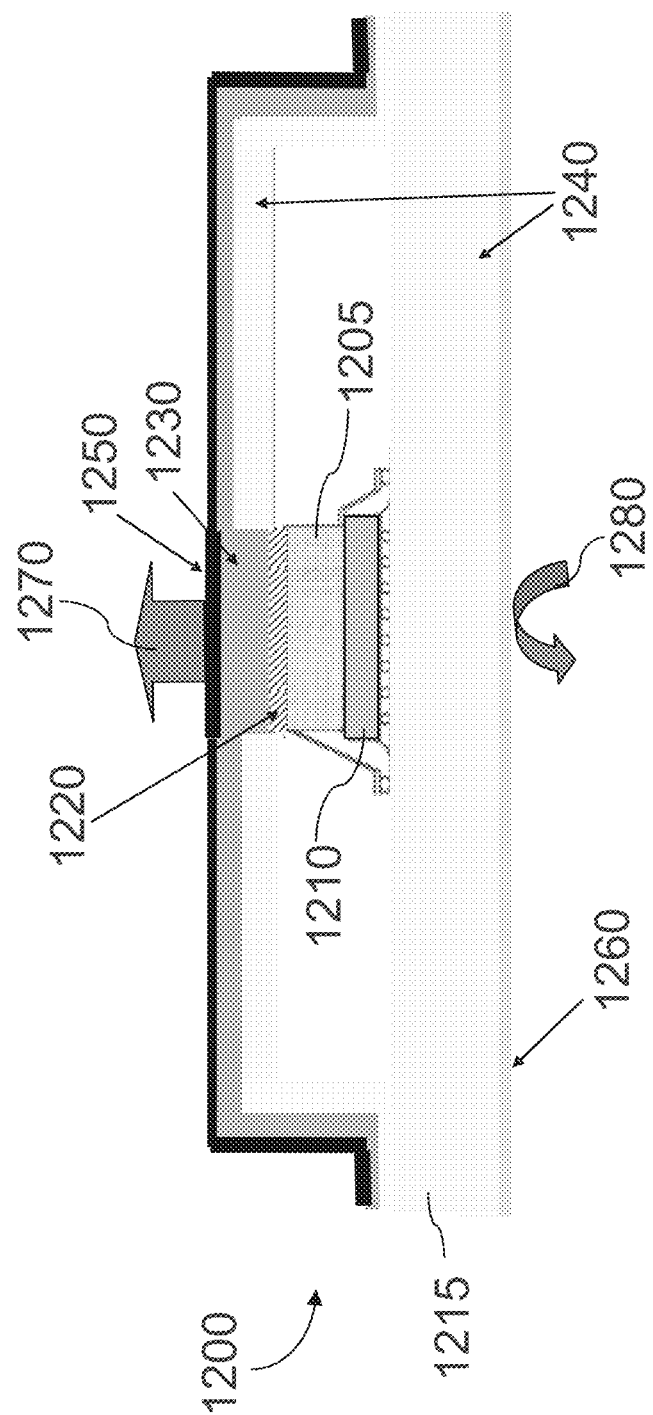
FIG. 12 is another illustrative schematic of a package for use in cooling applications, in accordance with certain examples.

In accordance with certain examples, a hybrid thermoelectric device 1205 is shown in FIG. 12 in a package 1200. In the illustration shown in FIG. 12, the hybrid thermoelectric device 1205 comprises a bulk thermoelectric disposed on a superlattice. One skilled in the art will recognize that the recitation of a bulk thermoelectric device and a superlattice is solely for illustrative purposes and is not intended to be limiting in scope. In accordance with the present invention a variety of alternative TEC devices may be utilized in creating a hybrid thermoelectric device. The package 1200 shown in FIG. 12 is suitable for use, for example, in environments where the ambient temperature exceeds a desired operating temperature of an electrical component 1210. In FIG. 12, the electrical component 1210 is shown as being packaged as a ball grid array and is electrically coupled to a printed circuit board 1215. A heat sink 1230 is in thermal communication with the hybrid thermoelectric device 1205 through an interface 1220, which acts to transfer heat from the hybrid thermoelectric device 1205 and to the heat sink 1230. The package 1200 may also include a thermal insulator 1240 to prevent or reduce heat entry from the ambient environment into the package 1200. As understood by one skilled in the art, the thermal insulator 1240 may be but is not limited to a material have sufficiently high insulative properties, an air gap, a vacuum or an inert gas. The package 1200 may also include a surface treatment 1250, wherein the surface treatment is selected to maximize heat transfer. A non-exhaustive list of suitable surface treatments 1250 include the application of a black surface finish suitable for maximizing thermal radiation or the application of a suitable surface roughness or texture again selected to maximize radiation. The package 1200 may also include a reflection treatment 1260 to reflect heat away as shown by arrow 1280. In operation, the hybrid thermoelectric device 1205 removes heat from the electrical component 1210 and transfers heat to the ambient environment as shown by arrow 1270. The package shown in FIG. 12 may be used to cool any electrical component including, but not limited to, optical sensors, optical detectors, microprocessors, memory chips, digital signal processors and the like.

Figure 13:
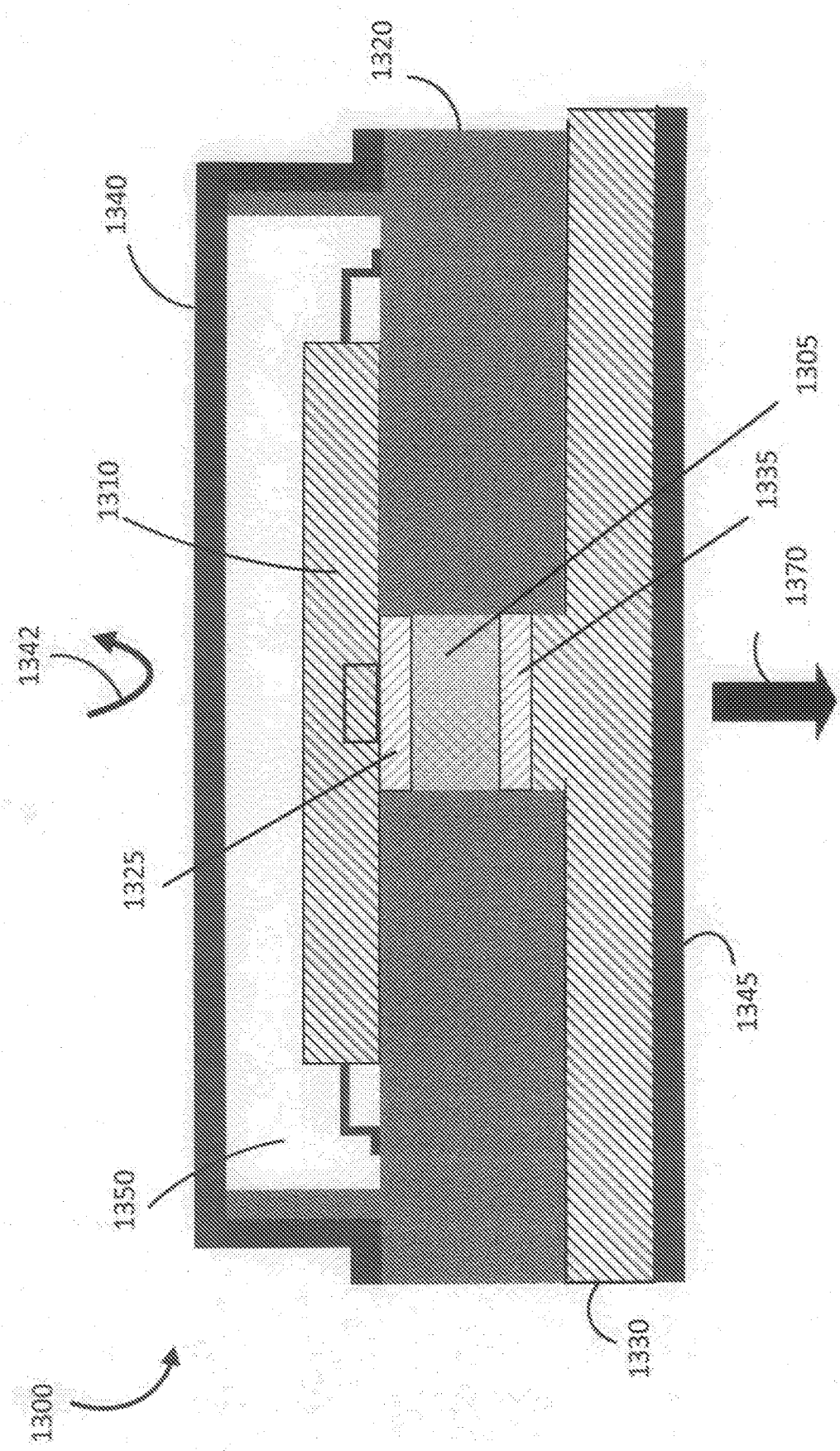
FIG. 13 is an additional illustrative schematic of a package for use in cooling applications, in accordance with certain examples.

In accordance with certain examples, a hybrid thermoelectric device 1305 is shown in FIG. 13 in a package 1300 that is configured to cool a packaged integrated circuit 1310. In certain examples, the hybrid thermoelectric device 1305 comprises a bulk thermoelectric disposed on a superlattice. In certain embodiments, the package 1300 is suitable for use, for example, in situations where the ambient temperature exceeds a desired operating temperature for the integrated circuit 1310. The integrated circuit 1310 is electrically coupled to a printed circuit board 1320. Between the integrated circuit 1310 and the hybrid thermoelectric device 1305 may be a thermal interface 1325. Between the hybrid thermoelectric device 1305 and a heat sink 1330 may be a second thermal interface 1335. The thermal interfaces 1325 and 1335 are designed to facilitate heat transfer away from the integrated circuit 1310. The package 1300 may also include a reflection treatment 1340 to reflect heat away as shown by arrow 1342 and a surface treatment 1345. The surface treatment 1345 may be selected to maximize radiant heat transfer as understood by one skilled in the art. The package 1300 may also include a thermal insulator 1350 to prevent or reduce heat entry from the ambient environment into the package 1300. In operation, the hybrid thermoelectric device 1305 removes heat from the integrated circuit 1310 and transfers heat to the ambient environment as shown by arrow 1370. The package shown in FIG. 13 may be used to cool any electrical component including, but not limited to, optical sensors, optical detectors, microprocessors, memory chips and the like.

Figure 14:
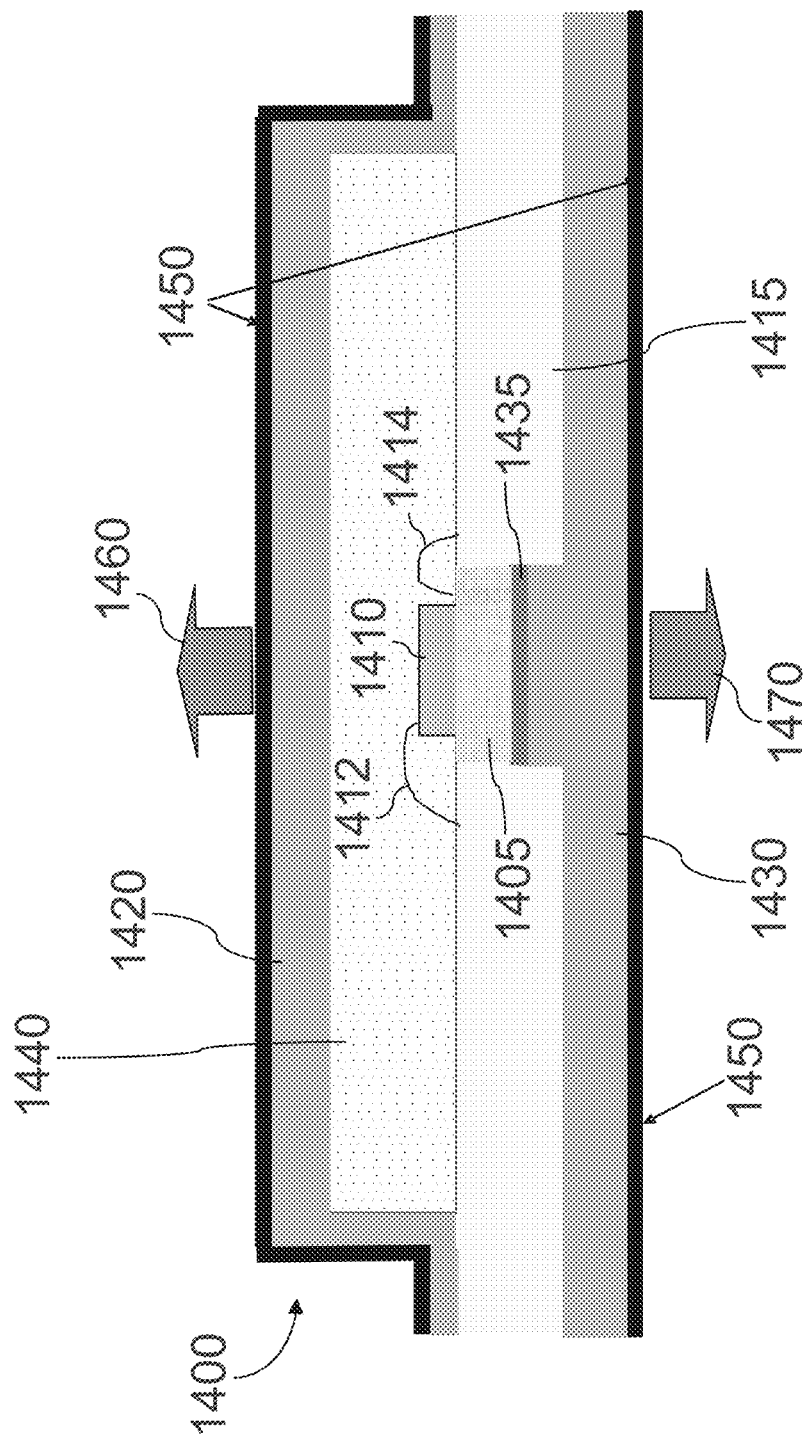
FIG. 14 is another illustrative schematic of a package for use in cooling applications, in accordance with certain examples.

In accordance with certain examples, a hybrid thermoelectric device 1405 is shown in FIG. 14 as a package 1400 that is configured to cool an electrical component 1410 that is electrically coupled to a printed circuit board 1415 through interconnects 1412 and 1414. In certain examples, the hybrid thermoelectric device 1405 comprises a bulk thermoelectric disposed on a superlattice. One skilled in the art will readily recognize that numerous alternative embodiments, using alternative TEC devices, may be practiced in accordance with the present invention. The package 1400 is suitable for use, for example, where it is desirable to cool the electrical component to an ambient temperature, e.g., to cool a hot electrical component to an ambient temperature. In accordance with one embodiment of the present invention, a heat generating electric component may be a high power consumption device consuming more than approximately 2 watts of power. The package 1400 includes a first heat sink 1420 and a second heat sink 1430, which may be the same heat sink in certain configurations. A medium 1440 may surround the electrical component 1410 and may be selected to facilitate heat transfer from the electrical component 1410 to the heat sink 1420. An optional thermal interface 1435 may exist between the hybrid thermoelectric device 1405 and the heat sink 1430 to facilitate heat transfer. The thermal interface may take several forums including gaseous, liquid- or gel-based forms selected for facilitating heat transfer. In accordance with one embodiment of the present invention, the thermal interface may be a thermal gel. The package 1400 may also include a surface treatment 1450 selected to maximize heat transfer by radiation. During operation of the electrical component 1410, heat may be transferred to heat sinks 1420 and 1430 and to the ambient environment as shown in arrows 1460 and 1470. The package shown in FIG. 14 may be used with any electrical component including, but not limited to, power field effect transistors (FET), digital signal processors, microprocessors, memory chips, and the like which generates sufficient heat to benefit from cooling to an ambient temperature.

Figure 15:
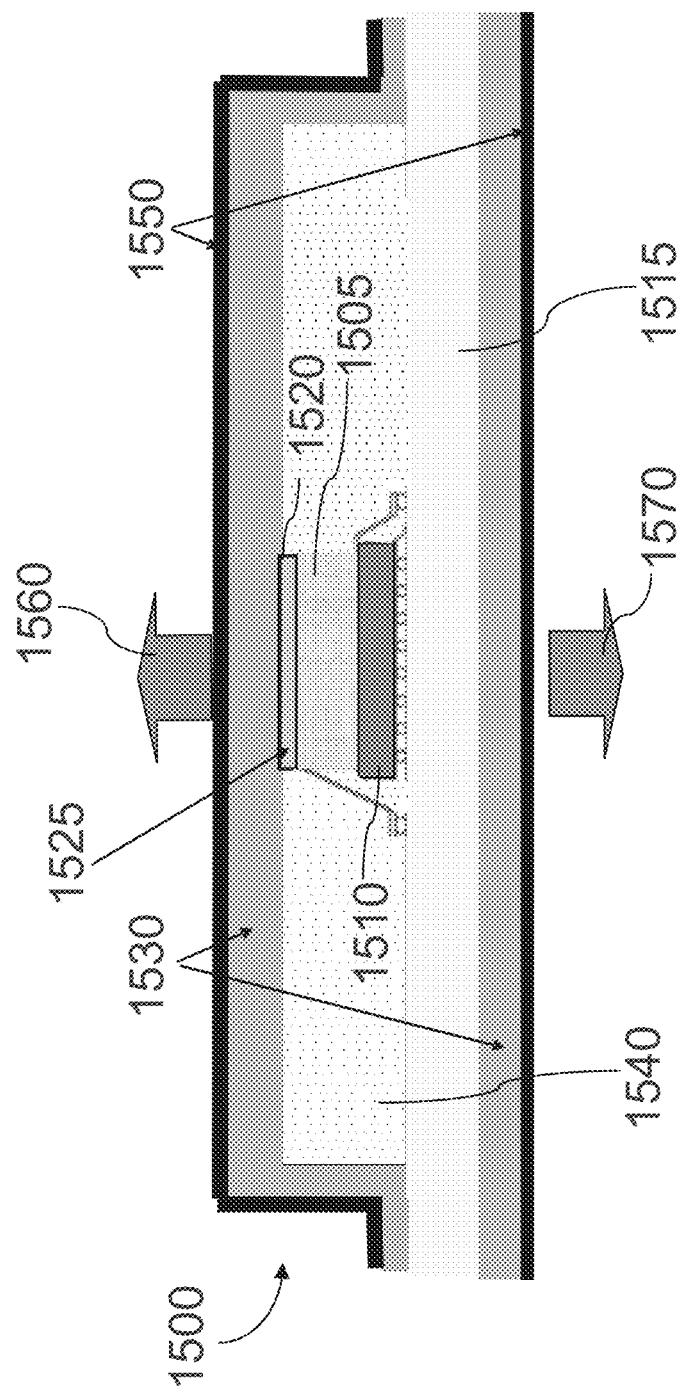
FIG. 15 is an additional illustrative schematic of a package for use in cooling applications, in accordance with certain examples.

In accordance with certain examples, a hybrid thermoelectric device 1505 is shown in FIG. 15 as a package 1500 that is configured to cool an electrical component 1510, shown as a ball grid array, on a printed circuit board 1515. The cooling of the electrical component 1510 may be to approximately the ambient temperature. In certain examples, the hybrid thermoelectric device 1505 comprises a bulk thermoelectric disposed on a superlattice. The package 1510 is suitable for use, for example, where it is desirable to cool the electrical component to an ambient temperature, e.g., to cool a hot electrical component to an ambient temperature. The package 1500 includes heat sinks 1530, which may be the same or two or more heat sinks. A medium 1540 may surround the electrical component 1510 and may be selected to facilitate heat transfer from the electrical component 1510 to the heat sinks 1530. An optional thermal interface 1525 may exist between the hybrid thermoelectric device 1505 and the heat sinks 1530 to facilitate heat transfer. During operation of the electrical component 1510, heat may be transferred to heat sinks 1530 and to the ambient environment as shown in arrows 1560 and 1570. The package shown in FIG. 15 may be used to cool any electrical component including, but not limited to, power field effect transistors (FET), digital signal processors, microprocessors, memory chips and the like.

Figure 16:
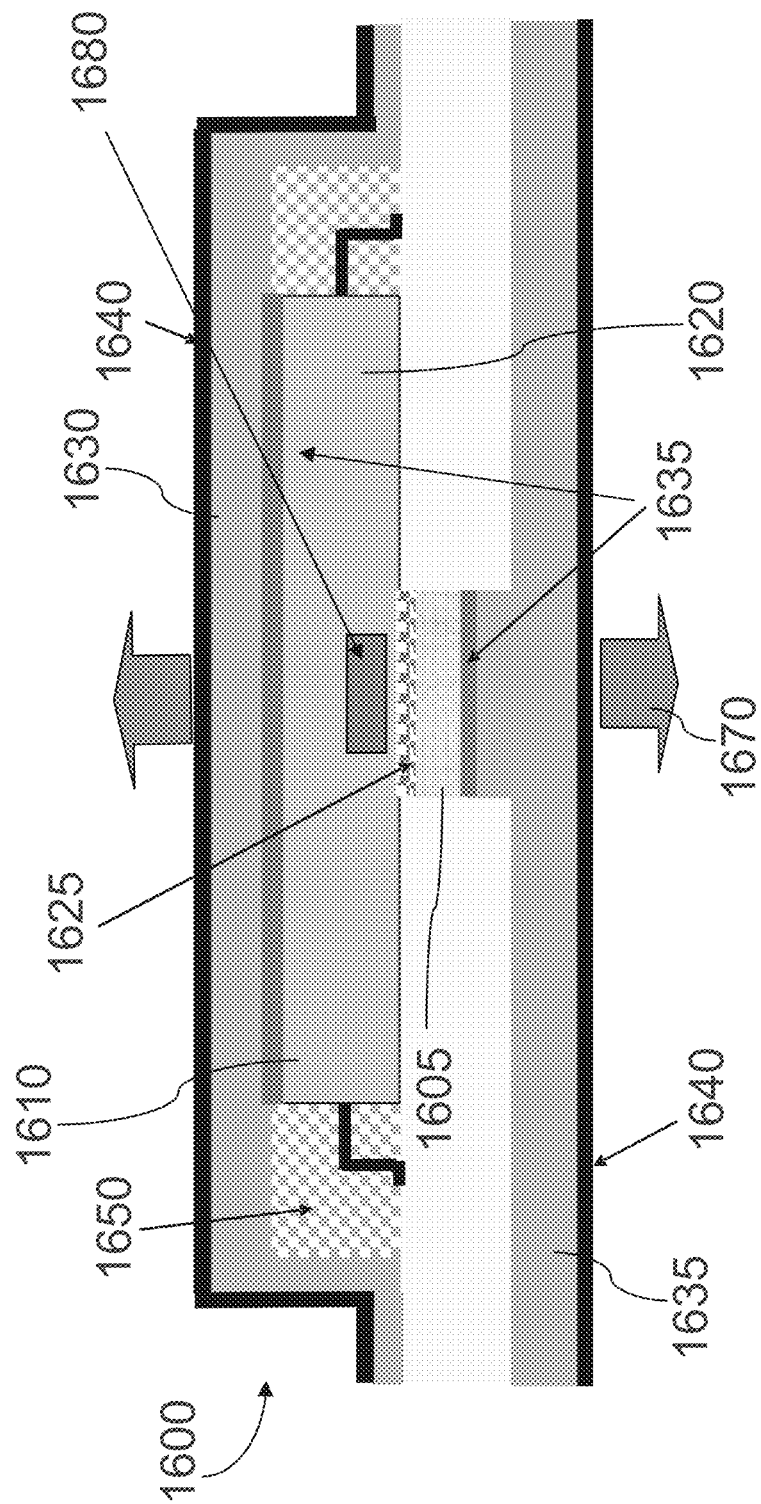
FIG. 16 is another illustrative schematic of a package for use in cooling applications, in accordance with certain examples.

In accordance with certain examples, a hybrid thermoelectric device 1605 is shown in FIG. 16 in a package 1600 that is configured to cool a packaged integrated circuit 1610. The cooling of the packaged integrated circuit 1610 may be to a temperature approximating the ambient temperature. In certain examples, the thermoelectric device 1605 comprises, but is not limited to, a bulk thermoelectric disposed on a superlattice. In certain embodiments, the package 1600 is suitable for use, for example, in situations where the operating temperature of the integrated circuit 1610 is substantially the same as the ambient temperature. The integrated circuit 1610 is electrically coupled to a printed circuit board 1620. Between the integrated circuit 1610 and the thermoelectric device 1605 may be a thermal interface 1625. Between the thermoelectric device 1605 and a heat sink 1630 may be a second thermal interface 1635. The thermal interfaces 1625 and 1635 are designed to facilitate heat transfer away from the integrated circuit 1610. The package 1600 may also include a surface treatment 1640 selected and applied to assist in maximizing heat transfer via radiation. The package 1600 may also include a thermal interface to transfer heat from the integrated circuit 1610 to the heat sink 1630. In operation, the thermoelectric device 1605 removes heat from the integrated circuit 1610 and preferentially from hot element 1680 and transfers heat to heat sink 1635 to the ambient environment as shown by the illustrated arrow 1670.

In accordance with certain examples, various materials may be used in the thermal interfaces described herein such as, for example, the thermal interfaces illustrated in FIGS. 11-16. Suitable materials include, but are not limited to copper, gold, platinum, thermal grease, thermal paste, copper/carbon nano-tube (CNT) composites and other materials that may be used in, or provide, a heat pipe. Additional suitable materials for use in a thermal interface will be readily selected by the person of ordinary skill in the art, given the benefit of this disclosure. Additionally, the hybrid TEC devices of FIGS. 11-16 have been described in the cooling of a device to a temperature below or approximately the ambient temperature. Such a description is not intended to be limiting in scope, as the various embodiments of the present invention described in the FIGS. 11-16 may be practiced to afford cooling to a variety of suitable temperatures.

Figure 17:
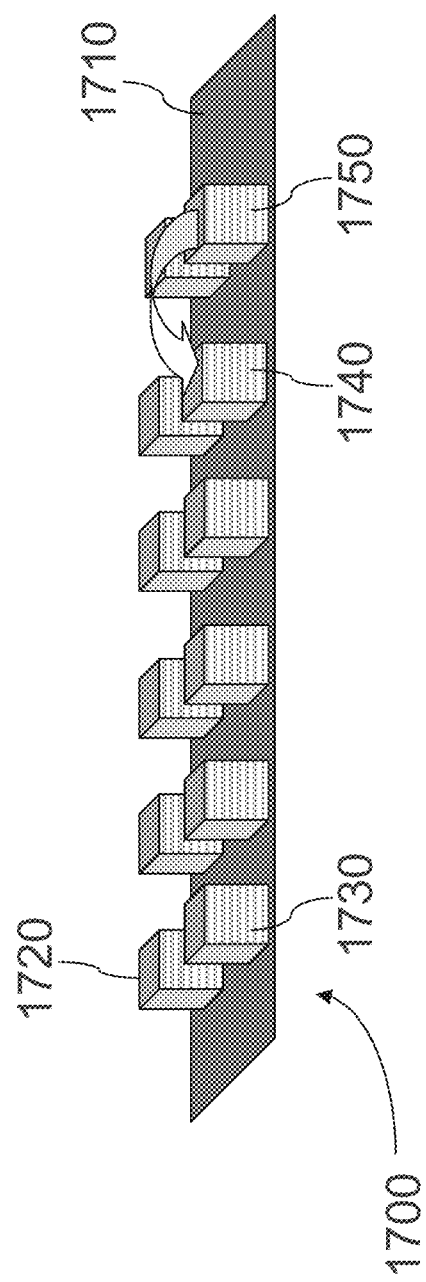
FIG. 17 is an array of thermoelectric devices, in accordance with certain examples.

In accordance with certain examples, a device comprising a substrate and a plurality of individual superlattices is provided. In certain examples, the plurality of individual superlattices may be arranged to form an array of thermoelectric devices. For example and referring to FIG. 17, a device 1700 includes a substrate 1710 and a plurality of individual superlattices, such as superlattices 1720 and 1730, coupled to the substrate 1710. In FIG. 17, the device 1700 is configured as an array of two-dimensional elements that form an array of thermoelectric devices. The device 1700 could be used as the Thermoelectric-like device for each of the packages shown in FIGS. 11-16.

In certain examples, the device 1700 may also include a power source electrically coupled to one or more of the superlattices. In some examples, the power source may be electrically coupled to all of the superlattices of the array. In certain examples, two or more power sources may be present and electrically coupled to different superlattices such that the cooling capacity of each superlattice may be controlled. In an alternative configuration, it may be desirable to cool certain areas of an electrical component while other areas of an electrical component do not require cooling. For example, a board sized array may be constructed and placed on a printed circuit board. Individual superlattices that overly areas of the printed circuit board that need to be cooled may be powered to provide cooling, while individual superlattices that overly areas of the printed circuit board that do not need to be cooled continuously may not be provided with power on demand. One or more of the superlattices of the array may also include a heat sink coupled to the superlattice to facilitate heat transfer to the external environment.

In accordance with certain examples, each of the individual superlattices of the array may include one or more of the semi-conducting materials disclosed herein. In certain examples, each individual superlattice has substantially the same composition as other superlattices in the array. In other examples, different materials may be used in different superlattices to provide differential cooling. For example, a first superlattice may be produced having alternating layers of BiTe/SbTe, and a second superlattice may be produced having alternating layers of PbSe/PbS. The difference in makeup of the superlattices provides for different amounts of cooling performance.

In accordance with certain examples, two or more of the individual superlattices of the array may be interconnected or coupled to each other. For example and referring to FIG. 17, a p-type superlattice 1740 may be interconnected to a n-type superlattice 1750 to provide a p-n couple. The p-n couple may be used for example to produce power or to extract heat, depending on the polarity of power provided to the p-n couple. It will be within the ability of the person of ordinary skill in the art, given the benefit of this disclosure, to couple two or more superlattices to provide a desired result such as cooling or power generation.

Figure 18:
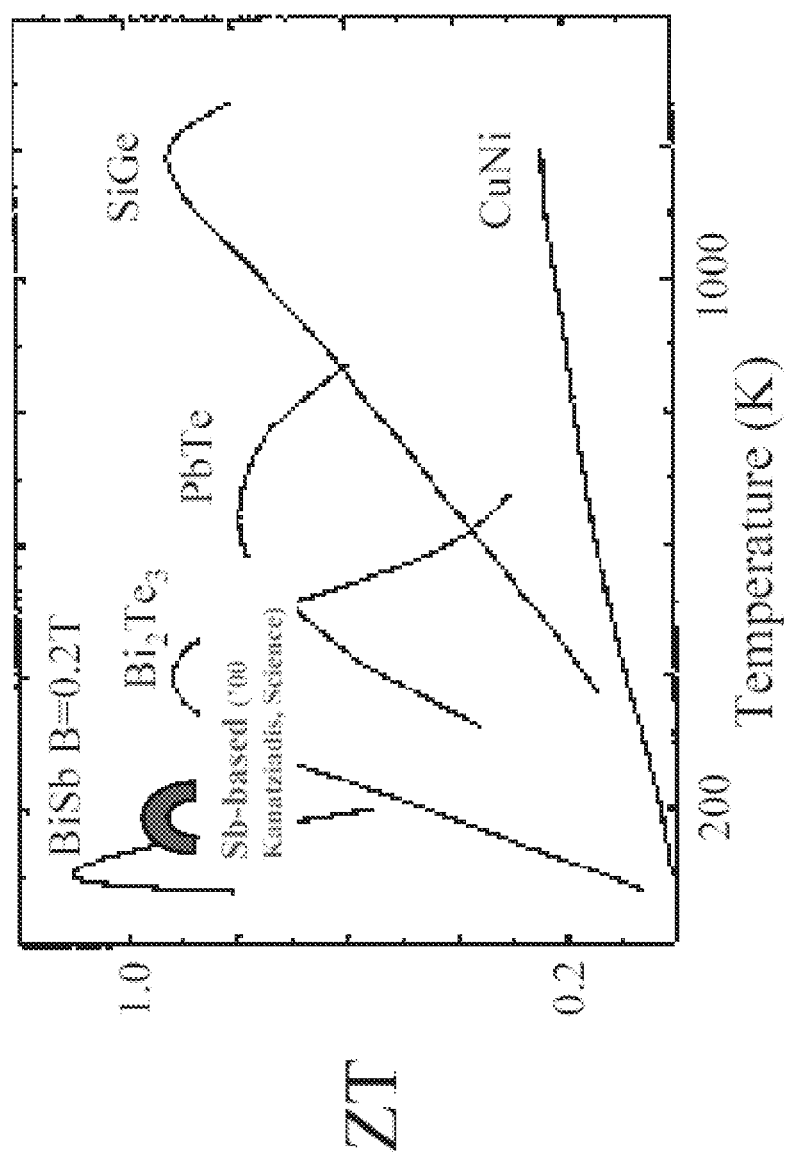
FIG. 18 is a graph of figure of merit (ZT) versus temperature for several illustrative materials, in accordance with certain examples.
Figure 19:
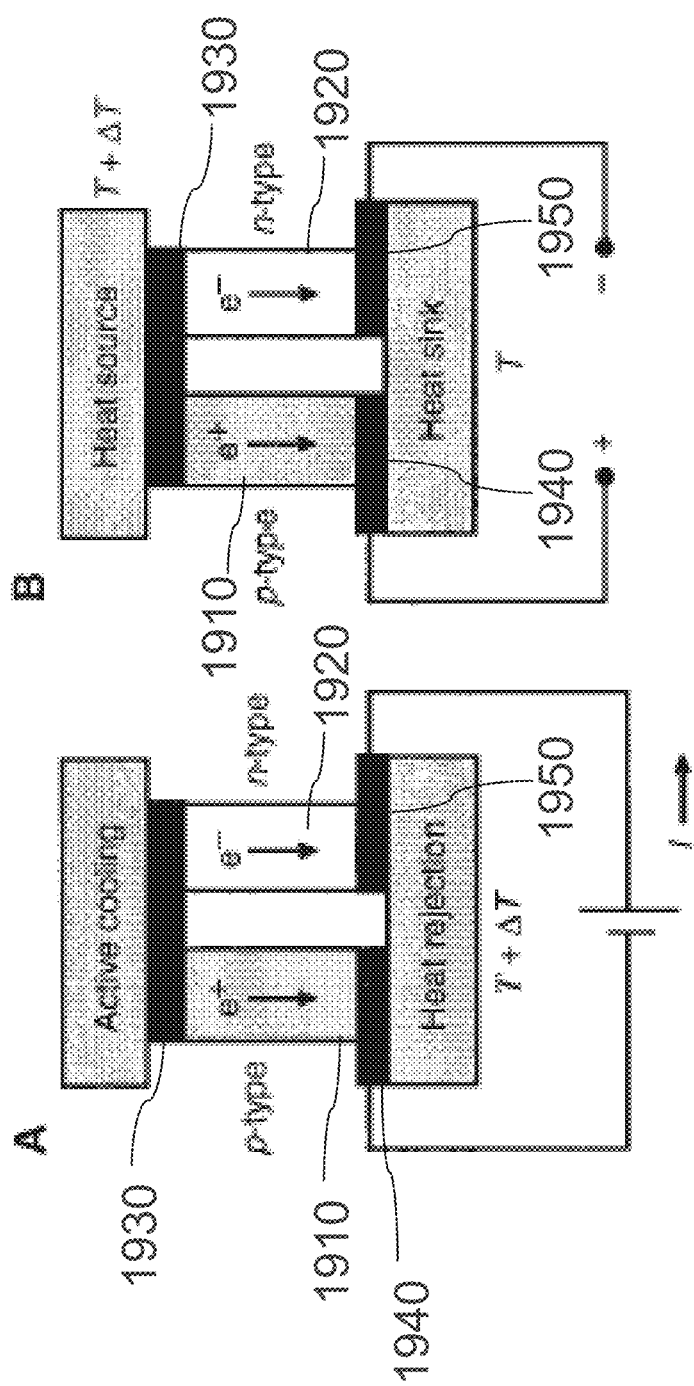
FIG. 19A is an illustrative thermoelectric device for cooling and FIG. 19B is an illustrative device for generating power, in accordance with certain examples.

In accordance with certain examples, the figure of merit value ZT is now discussed to illustrate further the embodiments described herein. Any of the superlattices used in the thermoelectric-like devices disclosed herein may include a material and/or structure having a so-called high figure of merit ZT, which is often used to characterize performance of thermoelectric materials and devices and other thermoelectric-like devices based on thermionic and field emission, such as the illustrative devices described herein. Referring to FIG. 18, an illustrative graph shows figures of merit ZT for various bulk materials suitable for use in the thermoelectric devices disclosed herein. Without wishing to be bound by any particular scientific theory, thermoelectric energy conversion is related to the Peltier effect whereby an imposed potential difference ($\Delta V$) between dissimilar metals or semiconductors in contact may result in a temperature gradient ($\Delta T$). When an electric current passes through a thermoelectric material (FIG. 19A), the heat transported by the charge carriers leads to a temperature gradient, with heat being absorbed on the cold side and rejected at the heat sink. The result is electronic refrigeration. Conversely, an imposed $\Delta T$ (Seebeck effect) will result in a voltage or current and thus in small-scale power generation, as shown in FIG. 19B. Thus, depending on the polarity provided to the thermoelectric device, the device may remove heat or provide power. In the configurations shown in FIGS. 19A and 19B, the thermoelectric device may include a first superlattice 1910, e.g., a p-type superlattice, and a second superlattice 1920, e.g., an n-type superlattice, coupled to substrate 1930. The device may also include suitable electrodes, such as electrodes 1940 and 1950, to provide electrical coupling between a power source and the superlattices.

In accordance with certain examples, the potential of a material for use in the superlattices of the thermoelectric devices disclosed herein may be determined by the material's dimensionless figure of merit, ZT, where T is the temperature and Z is defined by Equation 1

$$Z = S^2 \sigma / \kappa \quad [1]$$

where S is the Seebeck coefficient or thermopower (S~$\Delta V / \Delta T$), of the material, $\sigma$ is the electrical conductivity and $\kappa$ is the total thermal conductivity comprised of electronic and lattice components. The electronic component or power factor, $S^2 \sigma$, is typically optimized as a function of carrier concentration through doping to give the largest ZT. ZT values may be determined experimentally. High-mobility carriers are most desirable in order to reach the highest electrical conductivity for a given carrier concentration. From Equation 1, a high Z results from high S and $\sigma$, and/or a low $\kappa$. For many bulk materials S and $\sigma$ are anti-correlated while $\sigma$ and $\kappa$ are correlated, which makes it very difficult to vary Z significantly.

Referring again to FIG. 18, typical materials used in existing Peltier coolers are an alloy of bismuth and tellurium ($Bi_2Te_3$), which has a maximum ZT value of about one. From the graph shown in FIG. 18, the maximum ZT value for $Bi_2Te_3$ occurs, however, at about 250 K, which can partially limit the operating range of Peltier coolers made from $Bi_2Te_3$ at higher temperatures. In particular, devices that include PbTe, SiGe and CuNi have maximum ZT values at temperatures substantially above 250 K and are particularly more useful materials for use in the superlattices of the thermoelectric devices disclosed herein.

In accordance with certain examples and as discussed above, the thermoelectric devices disclosed herein may be designed to act as a cooling device to transfer heat away from an electrical component. A general expression for the amount of heat Q transferred is shown in Equation 2

$$Q = S_{p,n} T_c I - \tfrac{1}{2}(I^2 R) - K\Delta T \qquad [2]$$

where $S_{p,n} T_c I$ represents thermoelectric cooling, ½ ($I^2R$) represents Joule heating and $K\Delta T$ represents heat conduction. A coefficient of performance (COP), which expresses the efficiency of heat transfer per unit input power W, may be represented by Equation 3.

$$COP = \frac{Q}{W} = \frac{\left\{ S_{p,n} T_c I - \frac{1}{2}(I^2 R) - K\Delta T \right\}}{\left\{ S_{p,n}(\Delta T)I + I^2 R \right\}} \qquad [3]$$

For material parameters ($S_{p,n}$, $\sigma_{p,n}$, $\kappa_{p,n}$), given a geometrical factor and the temperature of the hot and cold junctions ($T_h$, $T_c$), Q and COP have their optimum values at different currents I. The current $Imax_{cool}$ gives the maximum cooling, and the current $Imax_{COP}$ gives the maximum COP. In most applications, the current provided to the thermoelectric device may be selected in the range between $Imax_{cool}$ and $Imax_{COP}$ to provide acceptable cooling performance for the thermoelectric device.

In accordance with certain examples, the use of materials with ZT values of about one alone may not provide acceptable performance in certain applications such as downhole cooling applications. In downhole applications, it may be desirable to produce the devices disclosed herein with superlattice structures comprising combinations of various thermoelectric materials or combinations of thermoelectric materials and metals. For example, two-dimensional thin films, one-dimensional wires, quantum dots and the like may be used to produce a superlattice of thermoelectric or thermoelectric-like structures for use in the devices and methods disclosed herein. By producing superlattices, the figure of merit ZT may be increased to 2 or more at 150° C. and cooling efficiency may be enhanced.

In certain examples, a superlattice for use in the devices disclosed herein may be configured into a two-dimensional quantum well structure. The superlattice may include two or more layers of different thermoelectric materials that are disposed parallel to each other. For example, multilayers parallel to an x-y plane with confinement by a wide-gap semiconductor (WGS) in the z-direction may lead to increases in Z with suitable choices of the layer thickness. Illustrative layer thicknesses include, but are not limited to, 2 nm to about 40 nm, more particularly 3 nm to about 20 nm. As discussed in more detail below, an interface may be created between the different thermoelectric materials, and properties of the interface may be used to control heat transfer. For example, increased phonon scattering at the interface may provide for reduced lattice thermal conductivity, which can also act to increase the Z value.

In accordance with certain examples, studies of low-dimensional systems, such as 1D quantum wires and 2D superlattices, have continued to attract considerable attention, stimulated by the need for smaller and faster electronic devices which demand more efficient local cooling of higher power densities. Zero-dimensional structures such as quantum dots hold even greater promise than 1D and 2D systems. However, unlike 1D or 2D systems, where at least one of the directions is not quantum confined and thus can provide electrical conduction, 0D structures are confined in all directions. To utilize the unique properties of quantum dots in the devices and methods disclosed herein where electron conduction is desired, there desirably exists a path for carrier transport, e.g., tunneling or hopping between individual dots. For this purpose, several structures based on quantum dots that enable transport phenomena exist. See Lin and Dresselhaus, Phys. Rev. B., 68, 075304 (2003) and Lin et al., Phys. Rev. B, 62, 4610 (2000).

Other approaches to increase the ZT value of materials for use in the devices disclosed herein are based on multilayer thermionic emission (MTE), which was first proposed by Mahan et al. See Mahan et al., J. Appl. Phys., 83, 4683 (1998) and Mahan and Woods, Phys. Rev. Lett., 80, 4016 (1998). Heterostructure thermionic emission has been considered by Shakouri and co-workers. See, e.g., Chen and Shakouri, Trans. of the ASME, 124, 242 (2002). Any of the configurations disclosed in these citations are suitable for use in the devices disclosed herein.

In accordance with certain examples, the use of superlattices may provide for additional degrees of freedom to produce improvements in cooling efficiencies over bulk materials. One approach may exploit the interfaces to reduce the thermal conductivity across the lattice planes while maintaining electronic conductivity from low electronic band edge offsets. See Venkatasubramanian et al., Nature, 413, 597 (2001) which achieved ZT values between 1.8-3 at room temperature. In addition, theoretical work by Vashaee and Shakouri has suggested that using highly degenerate semiconductor and metal-based superlattices in the quasi-linear transport regime can achieve thermoelectric-like power factors exceeding bulk values. See Phys. Rev. Lett., 92, 1061203 (2004) and J. Appl. Phys., 95, 1233 (2004).

In accordance with certain examples, metal superlattices may also be used in the thermoelectric-like devices disclosed herein. Illustrative metal superlattices are described, for example, in J. Appl. Phys., 95, 1233 (2004). Suitable metals for use in the superlattices disclosed herein include, but are not limited to, ternary and quaternary semiconductors.

In accordance with certain examples, the thermoelectric-like devices disclosed herein may provide cooling by combining thermionic emission and tunneling. Careful tailoring of the applied field and the spatial gap (10-15 nm) may result in electrons above the Fermi level being the dominant tunneling component (tunneling from below the Fermi level would work opposite to cooling) in addition to the thermionic component.

In accordance with certain examples, the thermoelectric-like devices disclosed herein may provide cooling using field emission. This concept exploits emission through the Schottky barrier at the metal-wide band gap (WBG) semiconductor interface and the fact that the WBG semiconductor will filter the injected electrons in a way that restricts tunneling from states below the Fermi energy. Thus emitted electrons will more likely originate from above the Fermi level which produces more efficient cooling. A key step is that the WBG semiconductor allows ballistic transport of the emitted electrons to vacuum. Calculations showed that cooling rates of several hundred Watts/cm$^2$ are potentially achievable.

In accordance with certain examples, a method of cooling an electrical component is disclosed. In certain embodiments, the electrical component may be a microprocessor, an integrated circuit or other electrical device on a printed circuit board whose performance may benefit from cooling. In certain examples, the electrical component may be located within a housing, such as a computer case, and the thermoelectric device may be placed on the electrical component and coupled to a power source to provide cooling. In some examples, the thermoelectric device may be placed on the electrical component during assembly using, for example, automated pick-and-place equipment. In other examples, the thermoelectric device may be formed on the electrical component using one or more of the deposition techniques described herein to provide an electrical component having an integral cooling device. In certain examples, the electrical component may be located downhole in a tool or device used in borehole drilling and/or logging procedures to identify petroleum bearing formations. Power may be provided to the thermoelectric device to generate a temperature gradient across the device to providing cooling. In other examples, the electrical component may include a scintillator crystal designed to detect emission of X-rays, gamma rays or the like. A thermoelectric device may be in thermal communication with a crystal to reduce thermal noise and to provide a more constant temperature to the crystal to enhance reproducibility. In certain examples, a thermoelectric device may be in thermal communication with an electrical component designed for use in space or other non-terrestrial applications. Additional electrical components that may be cooled using the devices and methods disclosed herein will be readily selected by the person of ordinary skill in the art, given the benefit of this disclosure.

In certain examples, the method includes providing thermal communication between a thermoelectric device and the electrical component and providing cooling of the electrical component by heat transfer from the electrical component to the thermoelectric device. In certain configurations, thermal communication may be accomplished by placing a surface of the thermoelectric device in contact with a surface of the electrical component. In other examples, thermal communication may be accomplished by bringing the thermoelectric device within a suitable distance from the electrical component such that a suitable amount of heat may be transferred from the electrical component to allow the electrical component to perform satisfactorily. In certain examples, suitable interstitial materials may be used to provide thermal communication. For example, thermal pastes and greases may be used to provide thermal communication between an electrical component and a thermoelectric device. Conductive spacers may also be used to provide thermal communication between an electrical component and a thermoelectric device. Additional suitable materials to facilitate thermal communication between an electrical component and a thermoelectric device will be readily selected by the person of ordinary skill in the art, given the benefit of this disclosure.

In accordance with certain examples, a kit for downhole cooling is provided. In certain examples, the kit comprises at least one thermoelectric device comprising a substrate and a superlattice coupled to the substrate. In certain embodiments, the superlattice comprises a first material and a second material coupled to the first material to provide an interface between the first and second materials. In certain examples, the kit may also include instructions for using the thermoelectric device to cool the electrical component. In some examples, the thermoelectric device of the kit may include an additional superlattice coupled to the substrate. In certain examples, the additional superlattice may comprise a first material and a second material coupled to the first material to provide an interface between the first and second materials. In certain embodiments, the thermoelectric device may further comprise a heat sink coupled to the superlattice and/or the additional superlattice.

In accordance with certain examples, a device for use in a downhole tool is disclosed. In certain examples, the device comprises at least one electrical component and a thermoelectric device coupled to at least one electrical component. In some examples, the thermoelectric device comprises a substrate and a superlattice coupled to the substrate. In certain embodiments, the superlattice comprises a first material and a second material coupled to the first material to provide an interface between the first and second materials. In certain examples, the electrical component of the downhole tool is an integrated circuit. In other examples, the electrical component of the downhole tool is located on a printed circuit board.

In accordance with certain examples, a thermoelectric cooling device for cooling a downhole electrical component is provided. In certain examples, the thermoelectric cooling device comprises a superlattice that includes a material having a ZT value of at least about 2 at 150° C. In some examples, the ZT value of a material used in the superlattice is at least about 4, e.g., between about 4 and about 7, at 150° C. In certain embodiments, the thermoelectric cooling device is effective to maintain an electrical component at or below about 200° C., more particularly at or below about 170° C.

When introducing elements of the examples disclosed herein, the articles "a," "an," "the" and "said" are intended to mean that there are one or more of the elements. The terms "comprising," "including" and "having" are intended to be open-ended and mean that there may be additional elements other than the listed elements. It will be recognized by the person of ordinary skill in the art, given the benefit of this disclosure, that various components of the examples can be interchanged or substituted with various components in other examples.

Although certain aspects, examples and embodiments have been described above, it will be recognized by the person of ordinary skill in the art, given the benefit of this disclosure, that additions, substitutions, modifications and alterations of the disclosed illustrative aspects, examples and embodiments are possible.

What is claimed is:
1. A package comprising:
a substrate;
an electrical component electrically coupled to the substrate;
a thermoelectric device in thermal communication with the electrical component, wherein the thermoelectric device comprises bulk thermoelectrical material disposed on and interfacing to a superlattice structure; and
a heat sink in thermal communication with both the thermoelectric device and an ambient environment;
wherein the thermoelectric device is configured to pass electrical current through the thermoelectric device and transfer heat by charge carriers that pass through the thermoelectric device, wherein the heat is absorbed from the electrical component and transferred to the heat sink for transfer from the heat sink to the ambient environment;
wherein the substrate has a first side opposite a second side with a passageway that extends through the substrate from the first side to the second side;
wherein the electrical component is disposed proximate the first side of the substrate;

wherein the heat sink is disposed proximate the second side of the substrate;

wherein the bulk thermoelectrical material and superlattice structure of the thermoelectric device are disposed in the passageway; and wherein the thermoelectric device is configured to transfer heat from the electrical component through the passageway to the heat sink.

2. The package of claim 1, further comprising:
a thermal insulator configured to reduce heat entry from the ambient environment into the package.

3. The package of claim 1, further comprising:
a heat reflection treatment disposed on at least one surface of the package.

4. The package of claim 1, wherein the package is configured to cool the electronic component below a temperature of the ambient environment.

5. The package of claim 4, wherein the temperature of the ambient environment is greater than 150° C.

6. The package of claim 1, further comprising:
a thermal interface disposed between the thermoelectric device and the heat sink.

7. The package of claim 6, wherein the thermal interface comprises at least one of a gel or liquid.

8. The package of claim 1, further comprising:
a radiant heat transfer treatment disposed on at least one surface of the package.

9. The package of claim 1, wherein the substrate is a printed circuit board.

10. The package of claim 1, wherein the bulk thermoelectric material is selected from the group consisting of InGaZnO, $Bi_2Te_3$, $Zn_4Sb_3$, PbTe, SnTe, SiGe, $CeFe_4Sb_{12}$, $CoSb_3$, $La_2Te_3$.

11. The package of claim 1, wherein the superlattice structure comprises nano structures.

12. The package of claim 1, wherein the electrical component comprises an integrated circuit.

13. The package of claim 1, wherein the electrical component comprises at least one of an imaging sensor, an optical sensor, a microprocessor, a memory chip, a digital signal processor, and a charge-coupled device.

14. The package of claim 1, wherein the superlattice structure comprises quantum dots.

15. The package of claim 1, further comprising:
a heat reflection treatment disposed on at least one surface of the package above the electrical component and the first surface of the substrate.

16. The package of claim 1, wherein the electrical component is disposed on the first surface of the substrate.

17. The package of claim 1, wherein a portion of the heat sink extends into the passageway.

* * * * *